(12) United States Patent
Kimura et al.

(10) Patent No.: US 10,768,258 B2
(45) Date of Patent: Sep. 8, 2020

(54) MAGNETIC RESONANCE IMAGING APPARATUS

(71) Applicant: Toshiba Medical Systems Corporation, Otawara-shi (JP)

(72) Inventors: Tokunori Kimura, Yaita (JP); Naotaka Sakashita, Utsunomiya (JP)

(73) Assignee: Canon Medical Systems Corporation, Otawara-shi (JP)

( * ) Notice: Subject to any disclaimer, the term of this patent is extended or adjusted under 35 U.S.C. 154(b) by 582 days.

(21) Appl. No.: 15/254,291

(22) Filed: Sep. 1, 2016

(65) Prior Publication Data
US 2017/0254868 A1 Sep. 7, 2017

(30) Foreign Application Priority Data
Mar. 2, 2016 (JP) .................................. 2016-040496

(51) Int. Cl.
*G01R 33/563* (2006.01)
*G01R 33/567* (2006.01)
(Continued)

(52) U.S. Cl.
CPC ... *G01R 33/56308* (2013.01); *G01R 33/5607* (2013.01); *G01R 33/5635* (2013.01);
(Continued)

(58) Field of Classification Search
CPC .......... G01R 33/56308; G01R 33/4838; G01R 33/5607; G01R 33/56316; G01R 33/5635;
(Continued)

(56) References Cited

U.S. PATENT DOCUMENTS

| 8,624,591 B2 | 1/2014 | Kimura |
| 9,488,711 B2 * | 11/2016 | Kimura ................. A61B 5/055 |

(Continued)

FOREIGN PATENT DOCUMENTS

| JP | 2011-183152 A | 9/2011 |
| JP | 2015-116474 A | 6/2015 |

OTHER PUBLICATIONS

Jinnan Wang, et al., "Simultaneous Noncontrast Angiography and intraPlaque hemorrhage (SNAP) Imaging for Carotid Atherosclerotic Disease Evaluation" Magnetic Resonance in Medicine, vol. 69, 2013, pp. 337-345.

(Continued)

*Primary Examiner* — Rishi R Patel
(74) *Attorney, Agent, or Firm* — Oblon, McClelland, Maier & Neustadt, L.L.P.

(57) ABSTRACT

A magnetic resonance imaging apparatus according to an embodiment includes processing circuitry. The processing circuitry performs at least one of data collection for collecting first data of an imaging region of a subject at a plurality of time intervals after a tag pulse is applied to fluid flowing into the imaging region, and data collection for collecting second data of the imaging region by differing at least one of applying or not-applying the tag pulse and a position of the applying. The processing circuitry performs phase correction for at least one of the first data and the second data by using data in which the longitudinal magnetization of the fluid is a positive value, to generate an image for each time phase.

11 Claims, 14 Drawing Sheets

(51) Int. Cl.
*G01R 33/565* (2006.01)
*G01R 33/56* (2006.01)
*G01R 33/483* (2006.01)

(52) U.S. Cl.
CPC ... *G01R 33/5673* (2013.01); *G01R 33/56545* (2013.01); *G01R 33/4838* (2013.01); *G01R 33/56366* (2013.01)

(58) Field of Classification Search
CPC ........ G01R 33/56366; G01R 33/56545; G01R 33/5673
See application file for complete search history.

(56) References Cited

U.S. PATENT DOCUMENTS

| | | | | |
|---|---|---|---|---|
| 2004/0162483 | A1* | 8/2004 | Kimura | G01R 33/56308 600/419 |
| 2010/0013475 | A1* | 1/2010 | Kimura | A61B 5/055 324/307 |
| 2011/0199082 | A1* | 8/2011 | Kimura | A61B 5/0263 324/306 |
| 2013/0096418 | A1* | 4/2013 | Jung | G01R 33/56366 600/419 |
| 2013/0314086 | A1* | 11/2013 | Li | G01R 33/56509 324/309 |
| 2014/0194730 | A1* | 7/2014 | Hoshino | A61B 5/0044 600/419 |
| 2015/0061675 | A1* | 3/2015 | Sakashita | G01R 33/56366 324/318 |
| 2015/0123659 | A1* | 5/2015 | Weingartner | A61B 5/055 324/309 |
| 2015/0131884 | A1* | 5/2015 | Kimura | A61B 5/0263 382/131 |
| 2016/0338613 | A1* | 11/2016 | Beckers | G01R 33/56308 |

OTHER PUBLICATIONS

Tokunori Kimura, et al., "A Real IR 3D T1-Weighted Black-Blood Imaging Technique Combining with White-Blood" Proc. Intl. Soc. Mag. Reson. Med., vol. 22, 2014 1 page.

* cited by examiner

MAGNETIC RESONANCE IMAGING APPARATUS

CROSS-REFERENCE TO RELATED APPLICATIONS

This application is based upon and claims the benefit of priority from Japanese Patent Application No. 2016-040496, filed on Mar. 2, 2016; the entire contents of which are incorporated herein by reference.

FIELD

Embodiments described herein relate to magnetic resonance imaging apparatus.

BACKGROUND

Conventionally, a method for after applying a tag pulse for labeling fluid flowing into an imaging region of a subject, collecting data of the imaging region to form an image of the fluid flowing through the subject, is known as an imaging method by a magnetic resonance imaging apparatus. Furthermore, in the method, there is a case in which both of an image referred to as a tag image and an image referred to as a control image are collected by differing applying or not-applying the tag pulse and a position of applying, and difference between both of the collected images is used, to acquire an image of fluid in which a signal of back ground tissue is inhibited. In this case, the control image is, for example, simply an image collected without being applied with the tag pulse that has been applied to the tag image, or an image collected by being applied with a similar pulse to the tag pulse in a different position from the position where the tag pulse is applied in the tag image. The similar pulse to the tag pulse, applied to acquire the control image is sometimes referred to as a control pulse to differentiate from the tag pulse. The above-described denominations such as the tag image and the control image are merely examples.

DETAILED DESCRIPTION

A magnetic resonance imaging (MRI) apparatus according to an embodiment includes processing circuitry. The processing circuitry performs at least one of data collection for collecting first data of an imaging region of a subject at a plurality of time intervals after a tag pulse is applied to fluid flowing into the imaging region, and data collection for collecting second data of the imaging region by differing at least one of applying or not-applying the tag pulse and a position of applying. The processing circuitry performs phase correction for at least one of the first data and the second data by using data in which the longitudinal magnetization of the fluid is a positive value, to generate an image for each time phase.

First Embodiment

Figure 1:
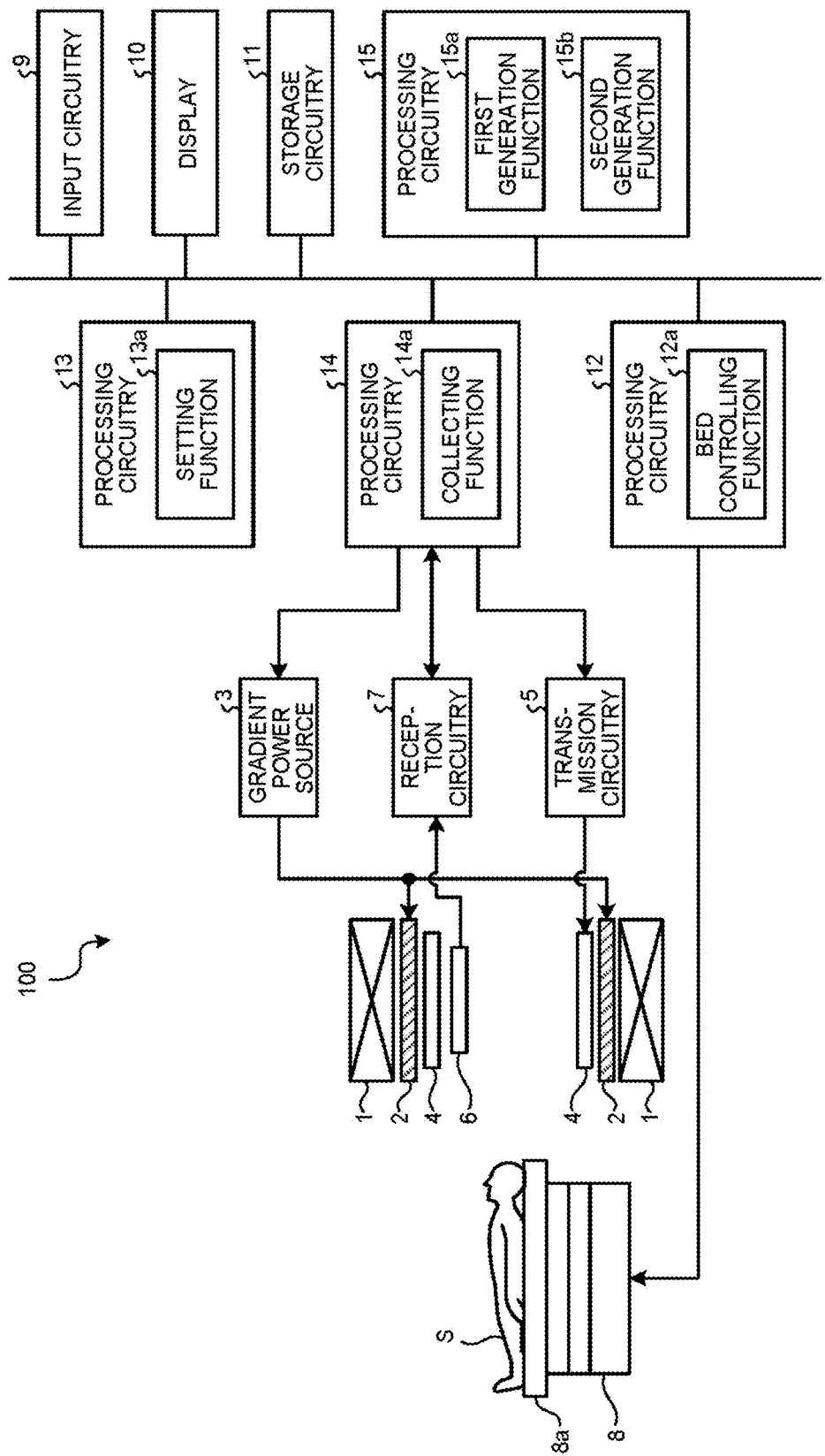
FIG. 1 is a schematic of an exemplary configuration of an MRI apparatus according to a first embodiment.

FIG. 1 is a schematic of an exemplary configuration of an MRI apparatus according to a first embodiment. For example, an MRI apparatus 100 includes a static magnetic field magnet 1, a gradient coil 2, a gradient power source 3, a transmission coil 4, transmission circuitry 5, a reception coil 6, reception circuitry 7, a couch 8, input circuitry 9, a display 10, storage circuitry 11, and processing circuitries 12 to 15, as illustrated in FIG. 1.

The static magnetic field magnet 1 is formed to be a hollow and a substantially cylindrical shape (including a shape of which a cross section orthogonal to a center axis of a cylinder is an elliptic shape), and generates a uniform static magnetic field in an imaging space formed in an inner peripheral side. The static magnetic field magnet 1 is achieved by, for example, a permanent magnet and a superconductive magnet.

The gradient coil 2 is formed to be a hollow and substantially cylindrical shape (including a shape of which a cross section orthogonal to a center axis of a cylinder is an elliptic shape), and is arranged in the inner peripheral side of the static magnetic field magnet 1. The gradient coil 2 has three coils which generate gradient magnetic fields each along an x-axis, a y-axis, and a z-axis orthogonal to each other. The x-axis, the y-axis, and the z-axis constitute an apparatus coordinate system inherent to the MRI apparatus 100.

For example, the direction of the x-axis is set to be a vertical direction, and the direction of the y-axis is set to be a horizontal direction. The direction of the z-axis is set to be the same direction as a direction of a magnetic flux of the static magnetic field generated by the static magnetic field magnet 1.

The gradient power source 3 supplies currents individually to each of the three coils of the gradient coil 2 to generate gradient magnetic fields each along the x-axis, the y-axis, and the z-axis in the imaging field. Generating the gradient magnetic fields each along the x-axis, the y-axis, and the z-axis appropriately allows generating of gradient magnetic fields each along a lead-out direction, a phase-encoding direction, and a slice direction orthogonal to each other. The axes each along the lead-out direction, the phase-encoding direction, and the slice direction constitute a logic coordinate system for defining a slice region or a volume region that is a subject of imaging. Hereinafter, the gradient magnetic field along the lead-out direction is referred to as a lead-out gradient magnetic field, the gradient magnetic field along the phase-encoding direction is referred to as a phase-encoding gradient magnetic field, and the gradient magnetic field along the slice direction is referred to as a slice gradient magnetic field.

Each of the gradient magnetic field is superimposed to the static magnetic field generated by the static magnetic field magnet 1 and is used for imparting spatial position information to a magnetic resonance (MR) signal. Particularly, the lead-out gradient magnetic field changes a frequency of the MR signal depending on a position in the lead-out direction to impart position information along the lead-out direction to the MR signal. The phase-encoding gradient magnetic field changes a phase of the MR signal along the phase-encoding direction to impart position information in the phase-encoding direction to the MR signal. The slice gradient magnetic field is used for determining a direction, a thickness, and a sheet number of the slice region when the imaging region is the slice region, and changes a phase of the MR signal depending on a position in the slice direction to impart position information along the slice direction to the MR signal when the imaging region is the volume region.

The transmission coil 4 is an RF coil for applying an RF pulse to the imaging space. Particularly, the transmission coil 4 is formed to be a hollow and a substantially cylindrical shape (including a shape of which a cross section orthogonal to a center axis of a cylinder is an elliptic shape) and is arranged in an inner side of the gradient coil 2. The transmission coil 4 applies a radio frequency (RF) pulse output from the transmission circuitry 5 to the imaging space.

The transmission circuitry 5 outputs an RF pulse corresponding to the Larmor frequency to the transmission coil 4. The transmission circuitry 5 has, for example, an oscillation circuit, a phase-selecting circuit, a frequency-converting circuit, an amplitude-modulation circuit, and an RF amplification circuit. The oscillation circuit generates the RF pulse of a resonance frequency inherent to a target nucleus positioned in the static magnetic field. The phase-selecting circuit selects a phase of the RF pulse output from the oscillation circuit. The frequency-converting circuit converts a frequency of the RF pulse output from the phase-selecting circuit. The amplitude-modulation circuit modulates an amplitude of the RF pulse output from the frequency-converting circuit according to a sinc function, for example. The RF amplification circuit amplifies the RF pulse output from the amplitude-modulation circuit and outputs the amplified RF pulse to the transmission coil 4.

The reception coil 6 is an RF coil for receiving the MR signal sent from a subject S. Particularly, the reception coil 6 is mounted to the subject S positioned in the imaging space and receives the MR signal sent from the subject S due to an influence of an RF magnetic field applied by the transmission coil 4. The reception coil 6 outputs the received MR signal to the reception circuitry 7. As the reception coil 6, for example, a dedicated coil is used for each portion of an imaging target. The dedicated coil herein is, for example, a reception coil for head, a reception coil for neck, a reception coil for shoulder, a reception coil for chest, a reception coil for abdomen, a reception coil for lower limb, or a reception coil for a spine.

The reception circuitry 7 generates MR signal data on the basis of the MR signal output from the reception coil 6 and outputs the generated MR signal data to the processing circuitry 13. The reception circuitry 7 has, for example, a selecting circuit, a front-stage amplification circuit, a phase detection circuit, and an analogue-digital converting circuit. The selecting circuit selectively inputs the MR signal output from the reception coil 6. The front-stage amplification circuit amplifies the MR signal output from the selecting circuit. The phase detection circuit detects a phase of the MR signal output from the front-stage amplification circuit. The analogue-digital converting circuit converts an analogue signal output from the phase detection circuit to a digital signal to generate MR signal data and outputs the generated MR signal data to the processing circuitry 13.

Herein, an example of a case in which the transmission coil 4 applies an RF pulse and the reception coil 6 receives an MR signal is described. However, the form of a transmission coil and a reception coil are not limited to this example. For example, the transmission coil 4 may further have a reception function for receiving an MR signal. Moreover, the reception coil 6 may further have a transmission function for applying an RF magnetic field. When the transmission coil 4 has a reception function, the reception circuitry 7 generates MR signal data also from the MR signal received by the transmission coil 4. When the reception coil 6 has a transmission function, the transmission circuitry 5 outputs an RF pulse also to the reception coil 6.

The couch 8 includes a couchtop 8a on which the subject S is mounted. When imaging of the subject S is performed, the couch 8 inserts the couchtop 8a to an imaging space formed in the inner side of the static magnetic field magnet 1 and the gradient coil 2. For example, the couch 8 is installed so that the longitudinal direction of the couch 8 is parallel to the center axis of the static magnetic field magnet 1.

The input circuitry 9 receives an input operation of various instructions and various information from an operator.

Particularly, the input circuitry 9 is connected to the processing circuitry 15, and converts the input operation received from the operator to an electrical signal and outputs the converted signal to the processing circuitry 15.

The input circuitry 9 is achieved by, for example, a track ball, a switch button, a mouse, a key board, or a touch panel.

The display 10 displays various information and various images. Particularly, the display 10 is connected to the processing circuitry 15, and converts data of various information and various images transmitted from the processing circuitry 15 to an electrical signal for displaying and outputs the signal. The display 10 is achieved by, for example, a liquid crystal monitor, a cathode ray tube (CRT) monitor, or a touch panel.

The storage circuitry 11 stores various data.

Particularly, the storage circuitry 11 stores MR signal data and image data for each subject S. The storage circuitry 11 is achieved by, for example, a semiconductor memory device such as a random access memory (RAM) and a flash memory, a hard disk, or an optical disk.

The processing circuitry 12 controls an operation of the couch 8. The processing circuitry 12 is achieved by, for example, a processor. For example, the processing circuitry 12 has a couch control function 12a. The couch control function 12a is connected to the couch 8, and outputs an electrical signal for controlling to the couch 8 to control the operation of the couch 8. For example, the couch control function 12a operates a drive mechanism of the couchtop 8a of the couch 8 so as to receive an instruction from an operator via the input circuitry 9 to move the couchtop 8a in a longitudinal direction, vertical direction, or horizontal direction and move the couchtop 8a according to the received instruction.

The processing circuitry 13 controls each component of the MRI apparatus 100 to overall control the MRI apparatus 100. The processing circuitry 13 is achieved by, for example, a processor. For example, the processing circuitry 13 has a setting function 13a. The setting function 13a receives an input of various imaging parameters for a pulse sequence from the operator via the input circuitry 9, and generates sequence execution data on the basis of the received imaging parameter. The setting function 13a transmits the generated sequence execution data to the processing circuitry 14 to execute various pulse sequences.

The sequence execution data is information that defines the pulse sequence indicating a procedure for collecting MR signal data. Particularly, the sequence execution data is information that defines a timing for supplying a current to the gradient coil 2 by the gradient power source 3 and intensity of the supplied current, intensity of a current of an RF pulse supplied to the transmission coil 4 by the transmission circuitry 5 and a timing of supplying, a detection timing for detecting an MR signal by the reception circuitry 7, and the like.

The processing circuitry 14 collects data of the subject S by executing the various pulse sequences. The processing circuitry 14 is achieved by, for example, a processor. For example, the processing circuitry 14 has a collecting function 14a. The collecting function 14a executes various pulse sequences on the basis of an imaging condition set by an operator. Particularly, the collecting function 14a executes various pulse sequences by driving the gradient power source 3, the transmission circuitry 5, and the reception circuitry 7 on the basis of the sequence execution data output from the processing circuitry 12.

The collecting function 14a receives MR signal data from the reception circuitry 7 and stores the received MR signal data to the storage circuitry 11 as a result of execution of the various pulse sequences. A set of the MR signal data received by the collecting function 14a is stored in the storage circuitry 11 as data constituting a k-space by being arranged two-dimensionally or three-dimensionally according to position information imparted by the above-mentioned lead out gradient magnetic field, phase encoding gradient magnetic field, and slice gradient magnetic field.

The processing circuitry 15 performs various data processing such as image reconstruction processing and image generation processing. The processing circuitry 15 is achieved by, for example, a processor. For example, the processing circuitry 15 has a first generation function 15a and a second generation function 15b. The first generation function 15a and the second generation function 15b will be described in detail later.

The exemplary configuration of the MRI apparatus 100 according to the present embodiment has been described. With this configuration, the MRI apparatus 100 has, for example, a function for forming an image of fluid flowing through the subject by an imaging method based on an arterial spin labeling (ASL) method. Hereinafter, an example of a case in which an imaging target is blood, is described. However, fluid to be an imaging target is not limited to blood. For example, even when an imaging target is cerebrospinal fluid (CSF), bile, or lymph, the present embodiment can be similarly performed, even though controlling depending on a speed of a movement of a target is required.

For example, there is an imaging method referred to as a phase sensitive IR (PSIR) method as a vessel wall imaging (VWI) for acquiring a blood vessel wall image. By the PSIR method, an image with a preferable contrast to noise ratio (CNR) can be acquired by generating a black blood (BB) image in which the inside of a blood vessel is a negative signal. By the PSIR method, data is collected in an inversion time (TI) in which the longitudinal magnetization Mz of blood becomes negative due to a magnetization prepared rapid gradient echo (MPRAGE) sequence. For correcting a background phase of the data, an image in which a blood is made to be a positive signal by extending the TI, is used. (That is, two TI images are used.) Furthermore, as an application of the PSIR method, there is an imaging method referred to as a simultaneous noncontrast angiography and intraplaque hemorrhage (SNAP) method. By the SNAP method, in addition to the BB image acquired by the PSIR method, a white blood (WB) image in which the inside of a blood vessel is made to be a positive signal is provided by inverting the brightness of the BB image and applying a maximum intensity projection (MIP) processing. However, the BB image acquired by these imaging methods is only of a single TI and is often not optimal as a T1 weighted (T1W) image of a background tissue (also referred to as a parenchymatous tissue). Furthermore, the image acquired by the SNAP method by inverting the brightness of the BB image, lacks the CNR for a WB image, and the TI being conformed to the BB image is too short for a labeled blood to flow into a peripheral blood vessel, and therefore, drawing a thin blood vessel is difficult.

As a method improved from the SNAP method, there is a method for collecting data of a single T1 by the MPRAGE sequence and using a TOF image separately imaged for correcting a background phase. However, even by this method, although data for phase correction newly collected is reduced compared with the SNAP method, only an image of a single time phase is acquired, and therefore sometimes a blood vessel is not drawn as BB in the overall image depending on a flowing rate and a position in the slice direction.

Thus, the MRI apparatus 100 according to the present embodiment is configured to be able to acquire an image in which blood and a background tissue are more preferably drawn according to blood kinetics over a plurality of time phases.

Particularly, the collecting function 14a of the processing circuitry 14 performs at least one of data collection of a tag mode for collecting data of an imaging region of a subject at a plurality of time intervals after the tag pulse is applied to blood flowing into the imaging region, and collecting data of a control mode for collecting data of the imaging region at a plurality of time intervals by differing applying or not-applying a tag pulse and a position of applying. The first generation function 15a of the processing circuitry 15 performs phase correction by using data in which the longitudinal magnetization Mz of blood is positive, for at least one of data collected by the tag mode and data collected by the control mode, to generate a BB image for each time phase. The second generation function 15b performs calculation in a time phase direction by using the BB image generated for each time phase to generate calculated image.

Hereinafter, such imaging method is named as a simultaneous time-encoding for bipolar MRA (STEP) method.

Note that the processing circuitry 14 is one example of the processing circuitry of Claims.

As a method for collecting data of a plurality of time phases by the collecting function 14a, various imaging methods can be used. For example, arterial spin labeling (ASL) method can be used. For example, a pulsed ASL (PASL) method, a continuous ASL (CASL) method, and a pseudo-continuous ASL (pCASL) method can be used. The PASL method uses a pulse wave and the CASL method uses a continuous wave. The pCASL method uses a number of short pulse waves. As the tag pulse, a spatial tag pulse, a speed selecting tag pulse, and an acceleration selecting pulse can be used.

In the present embodiment, the collecting function 14a performs data collection by an imaging method of a signal targeting with alternating radiofrequency (STAR) system or a flow-sensitive alternating inversion recovery (FAIR) system, being one type of the arterial spin labeling (ASL) method. In the present embodiment, the collecting function 14a performs data collection by a signal targeting with alternating radio frequency with asymmetric inversion slab (ASTAR) method being one of imaging methods of the STAR system.

In the ASL method, data collection of a tag mode for collecting data of an imaging region of the subject at a time when a prescribed waiting time (hereinafter, referred to as TI) elapses after a tag pulse is applied to blood flowing into the imaging region, and data collection of a control mode for collecting data of the imaging region by differing applying or not-applying a tag pulse and a position of applying, are performed. The tag pulse is an RF pulse in which the longitudinal magnetization becomes saturated or a negative value. For example, the tag pulse is an RF pulse of which a flip angle is equal to or larger than 90°. More particularly, the tag pulse is an inverted pulse of which a flip angle is 180°. A tag image is generated on the basis of data collected by the tag mode, a control image is generated on the basis of data collected by the control mode, and an image in which blood of an imaging target is drawn is generated by difference of these images. The control image is, for example, simply an image collected without being applied with the tag pulse that has been applied in the tag image, an image collected by applying a similar pulse to the tag pulse in a different position from the tag pulse applied in the tag image, or the like. The similar pulse to the tag pulse applied to acquire a control image is sometimes referred to as a control pulse to differentiate from the tag pulse. The above-described denominations such as the tag image and the control image are merely examples.

In an imaging method of the STAR system, a tag pulse is applied in an upstream portion of blood flowing into the imaging region of the subject in the tag mode. In the ASTAR method, a similar control pulse to the tag pulse is applied in a position not affecting blood in order to cancel magnetization transfer (MT) effect in the control mode. On the other hand, in an imaging method of the FAIR system, a tag pulse is applied to a range including an upper stream portion of blood flowing into an imaging region of a subject and the imaging region in the tag mode, and a control pulse is applied to a range including the imaging region in the control mode.

By performing such data collection by the ASL method plural times while changing the TI, images of blood of a plurality of time phases can be acquired. For example, when data collection of the tag mode and data collection of the control mode are performed continuously, a Hadamard encode (HE) method can be used.

In this embodiment, the first generation function 15a further generates a difference image between an image generated from data collected in the tag mode and an image generated from data collected in the control mode, a difference image between images generated from data collected in the tag mode, or a difference image between images generated from data collected in the control mode, for each time phase.

Various difference methods can be used as a method for differentiating an image by the first generation function 15a. For example, an N-N method for differentiating a tag image and a control image of a plurality of time phases in a combination of each time phase, and an N-1 differentiating method for collecting only one of a tag image and a control image of a plurality of time phases and differentiating an image of any one time-phase of the images of the plurality of time phases and an image of each time phase, can be used.

In the STEP method described in the present embodiment, various combinations of the above-described imaging methods and differentiating method can be used. The following describes a STEP_ASTAR_N-N method using the ASTAR method and the N-N differentiating method, a STEP_ASTAR_N-1 method using the ASTAR method and the N-1 differentiating method, and a STEP_FAIR_N-N method using the imaging method of the FAIR system and the N-N differentiating method, as the most typical examples.

First, the STEP_ASTAR_N-N method is described. In the STEP_ASTAR_N-N method, a tag image and a control image are generated for each of a plurality of TI and a difference image between the tag image and the control image for each TI is generated as a blood image (ASL image).

Figure 2:
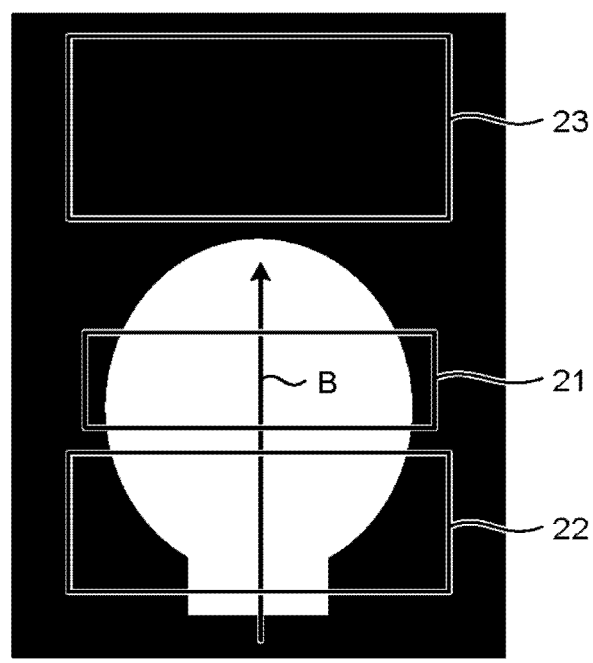
FIGS. 2 to 4 are schematics of an example of a STEP_ASTAR_N-N method according to the first embodiment.
Figure 3:
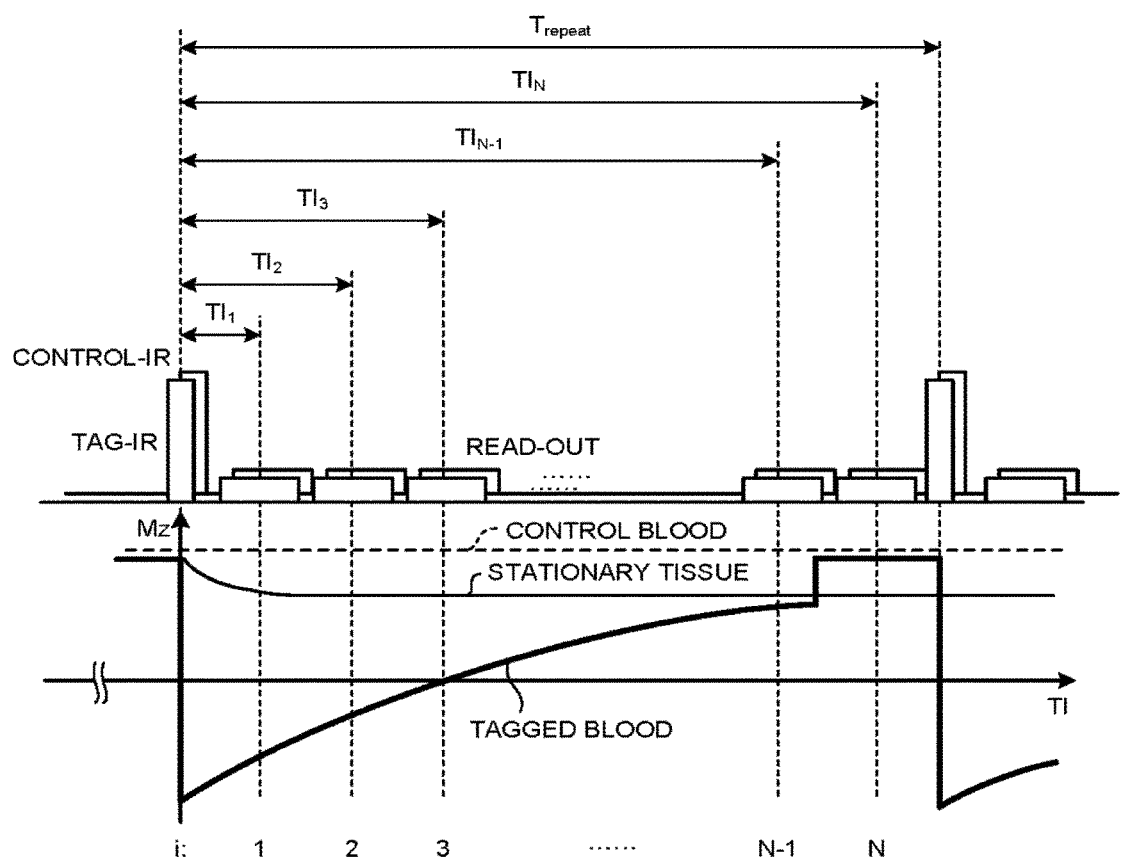
Figure 4:
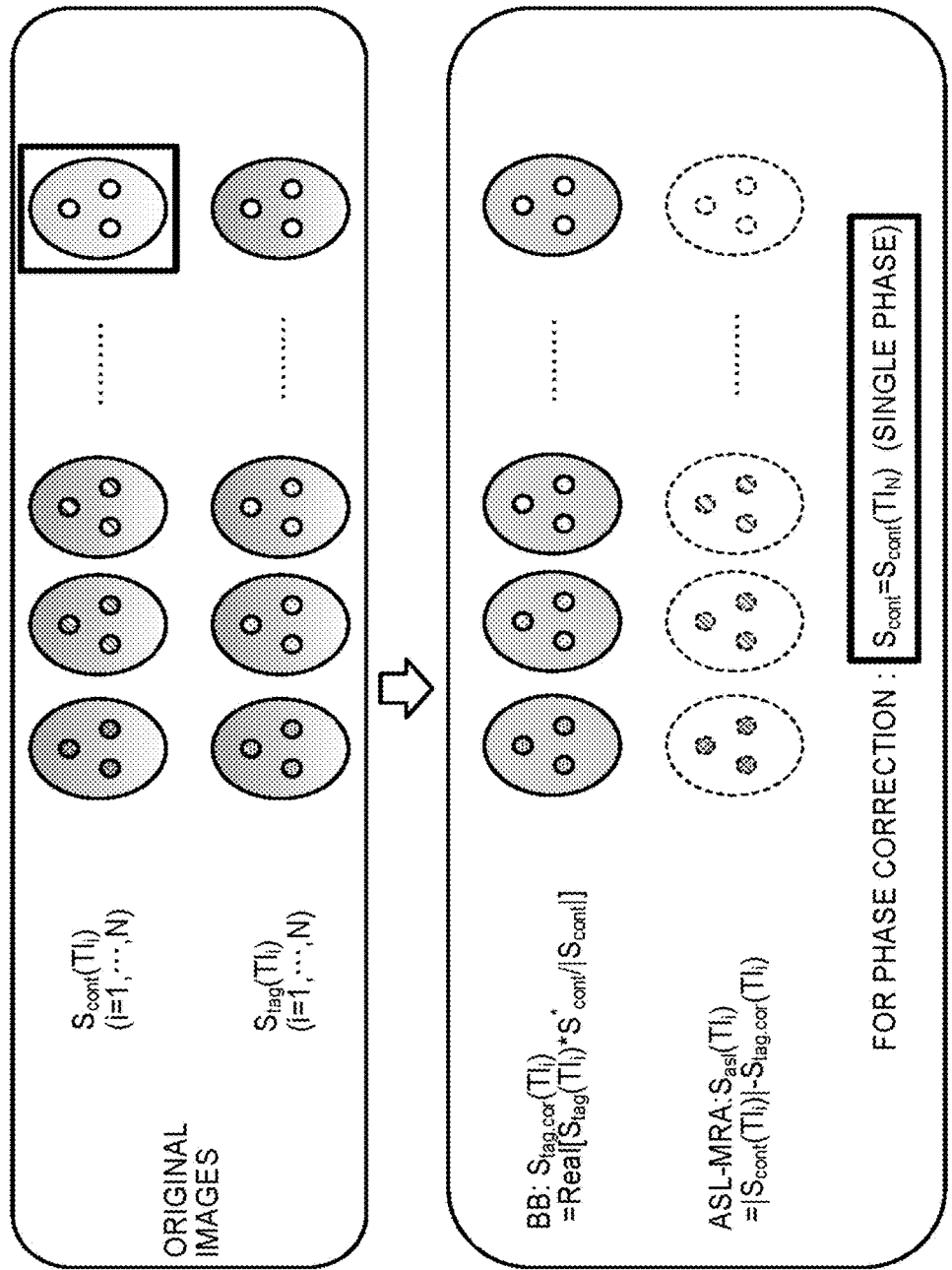

FIGS. 2 to 4 are schematic of one example of the STEP_ASTAR_N-N method according to the first embodiment. For example, as illustrated in FIG. 2, in the STEP_ASTAR_N-N method, an application region 22 of a tag pulse is set in an upper stream portion of blood B flowing into an imaging region 21. An application region 23 of a control pulse is set in an opposite position from the application region 22 of the tag pulse with respect to the imaging region 21. Each of the imaging region 21 and application regions 22 and 23 are set by a setting function 13a.

The collecting function 14a performs data collection of the tag mode and data collection of the control mode for each of $TI_1$, $TI_2$, $TI_3$, ... $TI_{N-1}$, and $TI_N$, where $TI_1 < TI_2 < TI_3 < ... < TI_{N-1} < TI_N$.

For example, as illustrated in the upper side of FIG. 3, the collecting function 14a performs data collection (read-out) of the imaging region 21 at a time when $TI_1$ elapses after a tag pulse (Tag-IR) is applied to the application region 22 of the tag pulse, as data collection of the tag mode. Then, the collecting function 14a performs data collection of the tag mode for each TI while changing the TI in order of $TI_2$, $TI_3$, ... $TI_{N-1}$, $TI_N$. The collecting function 14a performs data collection of the imaging region 21 at a time when $TI_1$ elapses after a similar control pulse (Control-IR) to the tag pulse is applied to the application region 23 of the control pulse, as data collection of the control mode. Then, the collecting function 14a performs data collection of the control mode for each TI while changing the TI in order of $TI_2$, $TI_3$, ... $TI_{N-1}$, $TI_N$. An example illustrated in FIG. 3 illustrates a case in which a flip angle $FA_{tag}$ of the tag pulse is set to be $FA_{tag}=180°$.

In this case, for example, as illustrated in the lower side of FIG. 3, in the tag mode, blood labeled by the tag pulse flows into the imaging region 21 while being gradually relaxed from a state where the longitudinal magnetization Mz is inverted as the TI becomes longer (tagged blood illustrated in FIG. 3). In the control mode, because saturated blood always flows into the imaging region 21, the longitudinal magnetization Mz of blood is always in a state of being saturated (control blood illustrated in FIG. 3). On the other hand, because the longitudinal magnetization Mz of a background tissue is not inverted by the tag pulse, even though there is a difference due to a blank time of data collection (read-out) and an MT effect, the longitudinal magnetization Mz becomes substantially the same in the tag mode and the control mode (stationary tissue illustrated in FIG. 3). Therefore, when the tag image and the control image are differentiated, an image is acquired in which a signal value in the background tissue portion is inhibited and a blood portion is emphasized.

For example, the collecting function 14a divides k-space into a plurality of regions according to a size of the k-space and performs data collection of $TI_1$ to $TI_N$ for each divided region. For example, the collecting function 14a repeats data collection of $TI_1$ to $TI_N$ for each divided region at prescribed time ($T_{repeat}$) intervals.

Successively, the first generation function 15a performs phase correction for data collected by the collecting function 14a by using data in which the longitudinal magnetization of blood is positive from among collected data of a plurality of time phases to generate a BB image for each time phase. The BB image is generated as a T1W image in which the inside of a blood vessel is negative signal. Hereinafter, a time phase is represented by "i" and time phases corresponding to $TI_1, \ldots, TI_N$ are each represented by $i=1, \ldots, N$.

Phase correction means correcting a phase of a signal shifted due to non-uniformity of a static magnetic field, an eddy current of a gradient magnetic field, a component (Maxwell term) of the gradient magnetic field other than a static magnetic field direction, or the like. This phase correction is performed by using phase data in which a background (static) tissue can be recognized as a phase distribution. By performing this phase correction, an encode of a signal value of blood inverted by the tag pulse can be reproduced.

For example, as illustrated in the upper side of FIG. 4, the first generation function 15a performs image reconstruction such as Fourier transform, for data collected by the tag mode for each time phase to generate a tag image $S_{tag}(TI_i)$. The first generation function 15a performs Fourier transform, for data collected by the control mode for each time phase to generate a control image $S_{cont}(TI_i)$. The tag image $S_{tag}(TI_i)$ and the control image $S_{cont}(TI_i)$ are each generated as a complex image.

Then, the first generation function 15a performs phase correction for the tag image $S_{tag}(TI_i)$ for each time phase. The first generation function 15a generates a real image from the phase corrected tag image for each time phase to generate a BB image $S_{tag.cor}(TI_i)$. The first generation function 15a uses a control image in which the longitudinal magnetization of blood is positive from among a plurality of control images $S_{cont}(TI_i)$, as phase data for phase correction. As one example, the first generation function 15a uses a control image $S_{cont}(TI_N)$ of the final phase N having the highest probability of the longitudinal magnetization of blood being positive.

For example, as illustrated in the lower side of FIG. 4, the first generation function 15a generates a BB image $S_{tag.cor}(TI_i)$ from a tag image $S_{tag}(TI_i)$ according to the following formula (1). In the formula (1), the $S_{cont}$ is phase data for phase correction and the $S_{cont}$ equals $S_{cont}(TI_N)$.

$$S_{tag.cor}(TI_i) = \text{Real}[S_{tag}(TI_i) * \text{Conj}(S_{cont})/|S_{cont}|] \quad (1)$$

Then, the first generation function 15a differentiates the BB image $S_{tag.cor}(TI_i)$ and the control image $S_{cont}(TI_i)$ for each time phase to generate a blood image $S_{asl}(TI_i)$.

For example, as illustrated in the lower side of FIG. 4, the first generation function 15a generates a blood image $S_{asl}(TI_i)$ from the BB image $S_{tag.cor}(TI_i)$ and the control image $S_{cont}(TI_i)$ according to the following formula (2).

$$S_{asl}(TI_i) = |S_{cont}(TI_i)| - S_{tag.cor}(TI_i) \quad (2)$$

The first generation function 15a preserves each generated image in the storage circuitry 11, and in response to a request from an operator, reads out the requested image from the storage circuitry 11 and outputs the image to the display 10.

In the above-described example, although data collection of the tag mode and data collection of the control mode are alternatively performed, embodiments are not limited thereto. For example, the collecting function 14a may perform data collection of the control mode for all TI after performing data collection of the tag mode for all TI. On the other hand, the collecting function 14a may perform data collection of the tag mode for all TI after performing data collection of the control mode for all TI.

In the above-described example, although data collection is continuously performed in plural times by one tag pulse or control pulse, embodiments are not limited thereto. For example, the collecting function 14a may perform data collection for one time-phase continuously by one tag pulse or control pulse for each TI.

In the above-described example, although an example of a case in which phase correction is performed for all time phases is described, embodiments are not limited thereto. For example, in a case in which a flip angle $FA_{tag}$ of the tag pulse is $FA_{tag} < 90°$, or in a case in which the TI is so long that a signal value of a blood vessel becomes positive even though a flip angle $FA_{tag}$ is $90° < FA_{tag} < 180°$, phase correction may not necessary be performed.

In the above-described example, although a control image of the final time phase is used as phase data for phase correction, embodiments are not limited thereto. As described above, in the control mode of the STEP_ASTAR_N-N method, because saturated blood always flows into the imaging region, all control images generated for each time phase can be recognized as equal. Therefore, a control image of any time phase can be used as phase data for phase correction. Furthermore, for example, separately collected TOF image can be used as phase data for phase correction. That case, for example, eliminates the need for waiting until data is collected in which the longitudinal magnetization is positive, and therefore the $T_{repeat}$ can be shorten.

Next, the STEP_ASTAR_N-1 method is described. In the STEP_ASTAR_N-1 method, a tag image is generated for each of a plurality of TI and a difference image between the tag image for the final time phase and the tag image for each time phase is generated as a blood image (ASL image) for each time phase.

Figure 5:
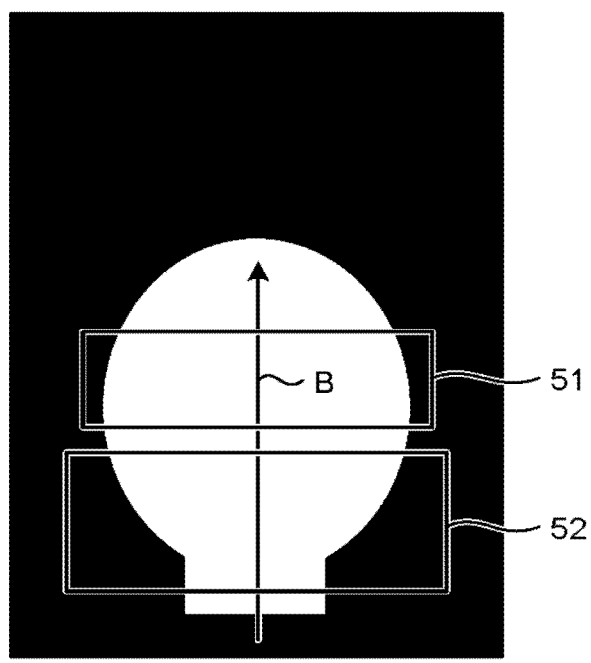
FIGS. 5 to 7 are schematics of an example of a STEP_ASTAR_N-1 method according to the first embodiment.
Figure 6:
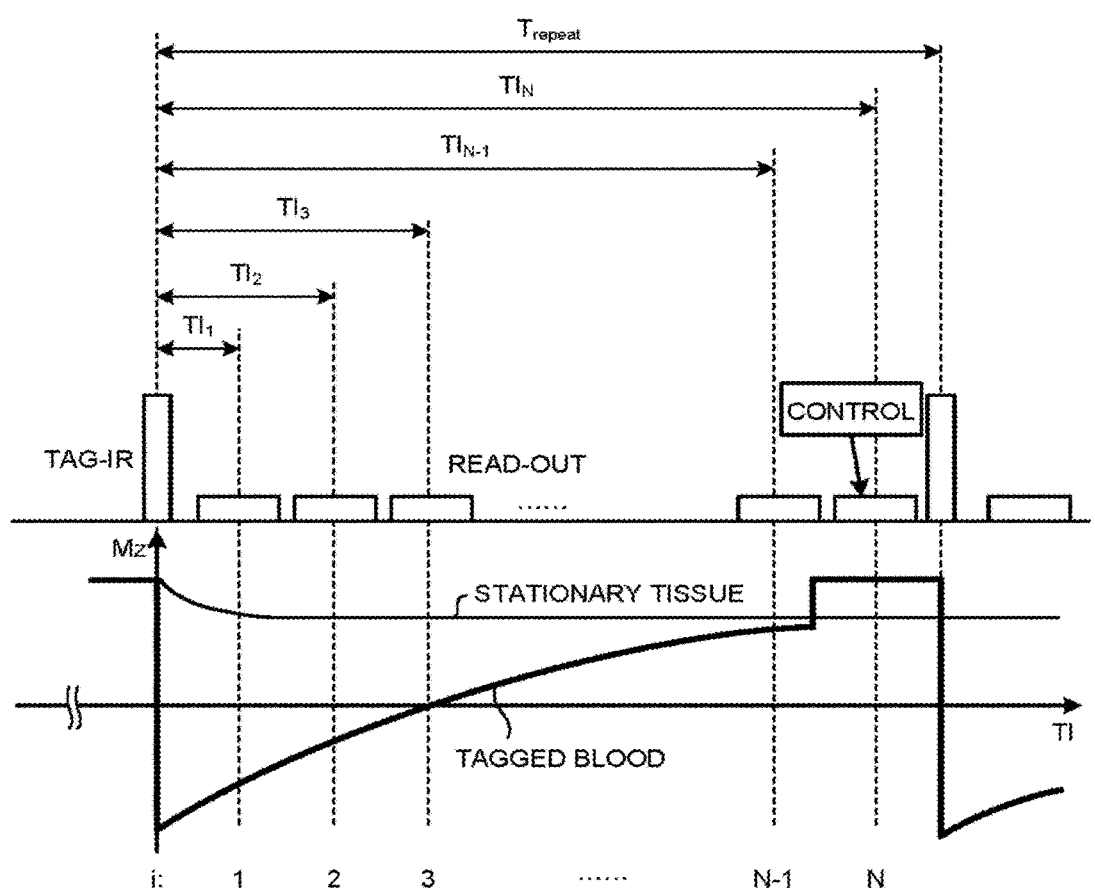
Figure 7:
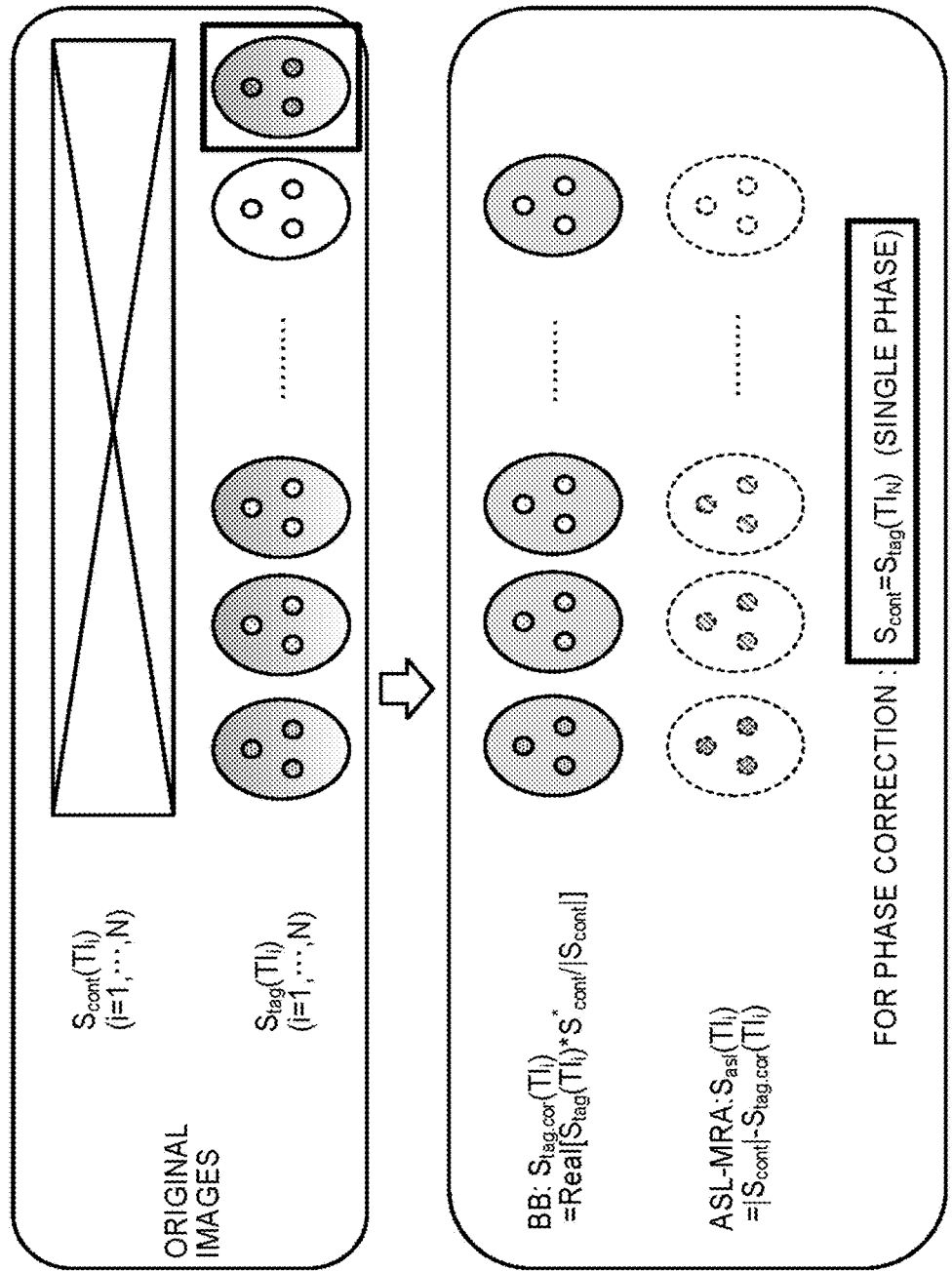

FIGS. 5 to 7 are schematics of an example of the STEP_ASTAR_N-1 method according to the first embodiment. For example, as illustrated in FIG. 5, in the STEP_ASTAR_N-1 method, an application region 52 of the tag pulse is set to an upper portion of blood B flowing into the imaging region 51. Each region of the imaging region 51 and the application region 52 is set by the setting function 13a.

Then, the collecting function 14a performs data collection of the tag mode for each of $TI_1, TI_2, TI_3, \ldots TI_{N-1}$, and $TI_N$, where $TI_1 < TI_2 < TI_3 < \ldots < TI_{N-1} < TI_N$.

For example, as illustrated in the upper side of FIG. 6, the collecting function 14a performs data collection (read-out) of the imaging region 51 at a time when $TI_1$ elapses after applying a tag pulse (Tag-IR) to the application region 52 of the tag pulse as data collection of the tag mode. After that, the collecting function 14a performs data collection of the tag mode for each TI while changing the TI in order of $TI_2$, $TI_3, \ldots TI_{N-1}$, $TI_N$. The example in FIG. 6 illustrates a case in which a flip angle $FA_{tag}$ of the tag pulse is set to be $FA_{tag} = 180°$.

In this case, for example, as illustrated in the lower side of FIG. 6, in the tag mode, blood labeled by the tag pulse flows into the imaging region 21 while being gradually relaxed from a state where the longitudinal magnetization Mz is inverted as the TI becomes longer (tagged blood illustrated in FIG. 6). When the longitudinal magnetization Mz of blood is substantially completely saturated in the final time phase N and a fluctuation of the signal intensity of the background tissue in the time phase direction can be ignored, the tag image of the final time phase N can be substituted for the control image. In this manner, data collection can be performed in substantially half time compared with a case in which the tag image and the control image are collected by the same number.

For example, the collecting function 14a divides k-space into a plurality of regions according to a size of the k-space and performs data collection of $TI_1$ to $TI_N$ for each divided region. For example, the collecting function 14a repeats data collection of $TI_1$ to $TI_N$ for each divided region at prescribed time ($T_{repeat}$) intervals.

Subsequently, the first generation function 15a performs phase correction for data collected by the collecting function by using data in which the longitudinal magnetization of blood is positive from among collected data of a plurality of time phases to generate a BB image for each time phase. The BB image is generated as a T1 W image in which the inside of a blood vessel is a negative signal. Hereinafter, a time phase is represented by "i" and time phases corresponding to $TI_1, \ldots, TI_N$ are each represented by $i=1, \ldots, N$.

For example, as illustrated in the upper side of FIG. 7, the first generation function 15a performs image reconstruction such as Fourier transform, for data collected by the tag mode for each time phase to generate a tag image $S_{tag}(TI_i)$. Each tag image $S_{tag}(TI_i)$ is generated as a complex image.

After that, the first generation function 15a performs phase correction for the tag image $S_{tag}(TI_i)$ for each time phase. The first generation function 15a generates a real image from the phase corrected tag image for each time phase to generate a BB image $S_{tag.cor}(TI_i)$. The first generation function 15a uses a tag image in which the longitudinal magnetization of blood is positive from among a plurality of tag images $S_{tag}(TI_i)$, as phase data for phase correction. Here, as one example, the first generation function 15a uses a tag image $S_{tag}(TI_N)$ of the final phase N having the highest probability of the longitudinal magnetization of blood being positive.

For example, as illustrated in the lower side of FIG. 7, the first generation function 15a generates a BB image $S_{tag.cor}(TI_i)$ from the tag image $S_{tag}(TI_i)$ according to the following formula (3), where $S_{cont}$ is phase data for phase correction and $S_{cont}$ equals $S_{tag}(TI_N)$.

$$S_{tag.cor}(TI_i) = \text{Real}[S_{tag}(TI_i) * \text{Conj}(S_{cont})/|S_{cont}|] \quad (3)$$

After that, the first generation function 15a differentiates the BB image $S_{tag.cor}(TI_i)$ generated by the tag image $S_{tag}(TI_i)$ and the tag image $S_{tag}(TI_i)$ for the final time phase N, for each time phase to generate a blood image $S_{asl}(TI_i)$.

For example, as illustrated in the lower side of FIG. 7, the first generation function 15a generates a blood image $S_{asl}(TI_i)$ from the BB image $S_{tag.cor}(TI_i)$ and the tag image $S_{tag}(TI_N)$ according to the following formula (4), where $S_{cont}$ is a control image for differentiation and $S_{cont}$ equals $S_{tag}(TI_N)$.

$$S_{asl}(TI_i) = |S_{cont}| - S_{tag.cor}(TI_i) \quad (4)$$

Then, the first generation function 15a preserves each generated image in the storage circuitry 11, and in response to a request from an operator, reads out the requested image from the storage circuitry 11 and outputs the image to the display 10.

In the above-described example, although data collection is continuously performed in plural times by one tag pulse, embodiments are not limited thereto. For example, the collecting function 14a may perform data collection for one time-phase by one tag pulse for each TI.

In the above-described example, although an example of a case in which phase correction is performed for all time phases has been described, embodiments are not limited thereto. For example, in a case in which a flip angle $FA_{tag}$ of the tag pulse is $FA_{tag} < 90°$, or in a case in which the TI is so long that a signal value of a blood vessel is positive even though a flip angle $FA_{tag}$ is $90° < FA_{tag} < 180°$, phase correction may not necessary be performed and an image may be an absolute value image.

In the above-described example, although a tag image of the final time phase is used as phase data for phase correction, embodiments are not limited thereto. For example, when the longitudinal magnetization of blood is positive, a tag image of the other time phase may be used as phase data for phase correction. Furthermore, for example, separately collected TOF image may be used as phase data for phase correction. That case, for example, eliminates the need for waiting until data in which the longitudinal magnetization is positive, is collected, and therefore $T_{repeat}$ can be shorten.

In the above-described example, although a tag image of the final time phase is used for both of phase data for phase correction and the control image for differentiation, embodiments are not limited thereto. For example, tag images of different time phases may be used for phase data for phase correction and the control image for differentiation. Furthermore, for example, separately collected TOF image may be used as phase data for phase correction and the tag image of the final time phase may be used as the control image for differentiation.

Next, the STEP_FAIR_N-N method is described. In the STEP_FAIR_N-N method, a tag image and a control image are generated for each of a plurality of T1 and a difference image between the tag image and the control image for each TI is generated as a blood image (ASL image).

Figure 8:
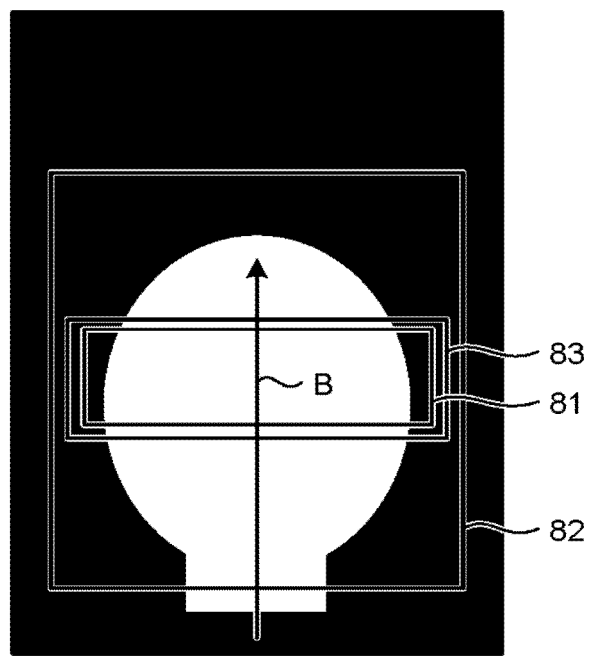
FIGS. 8 to 10 are schematics of an example of a STEP_FAIR_N-N method according to the first embodiment.
Figure 9:
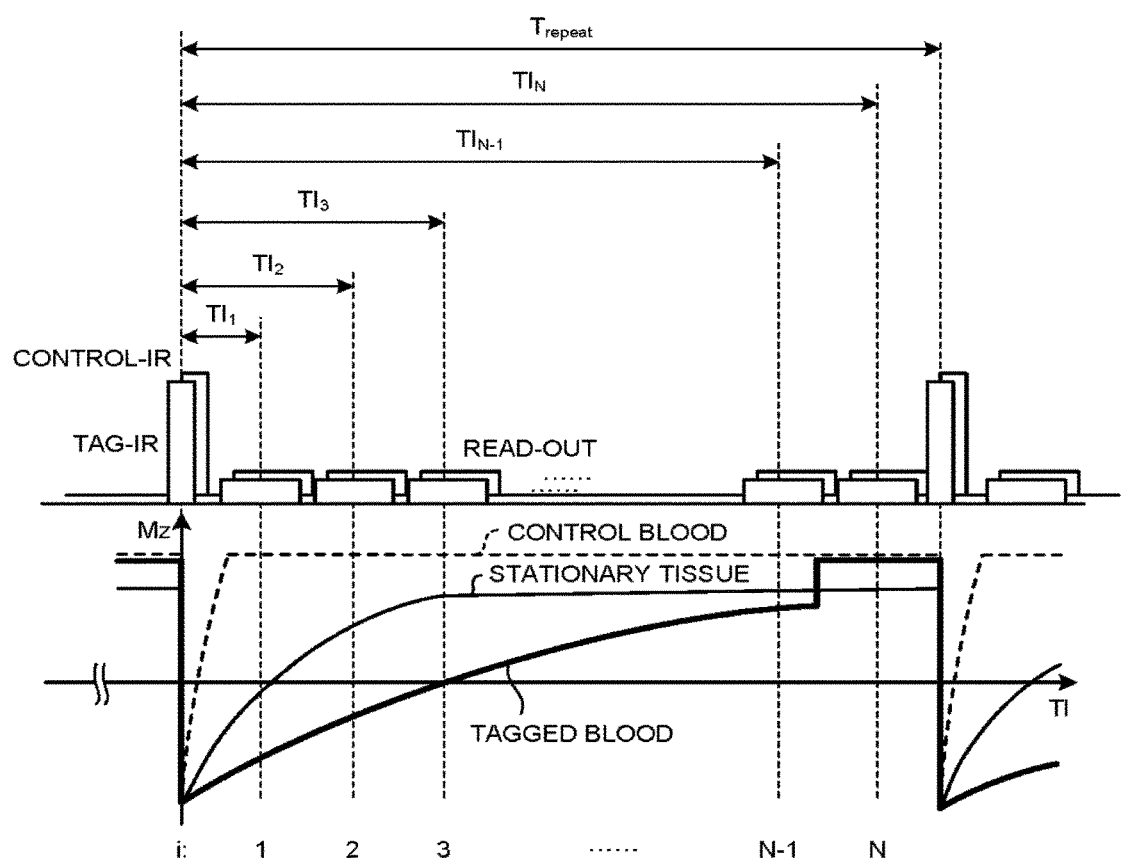
Figure 10:
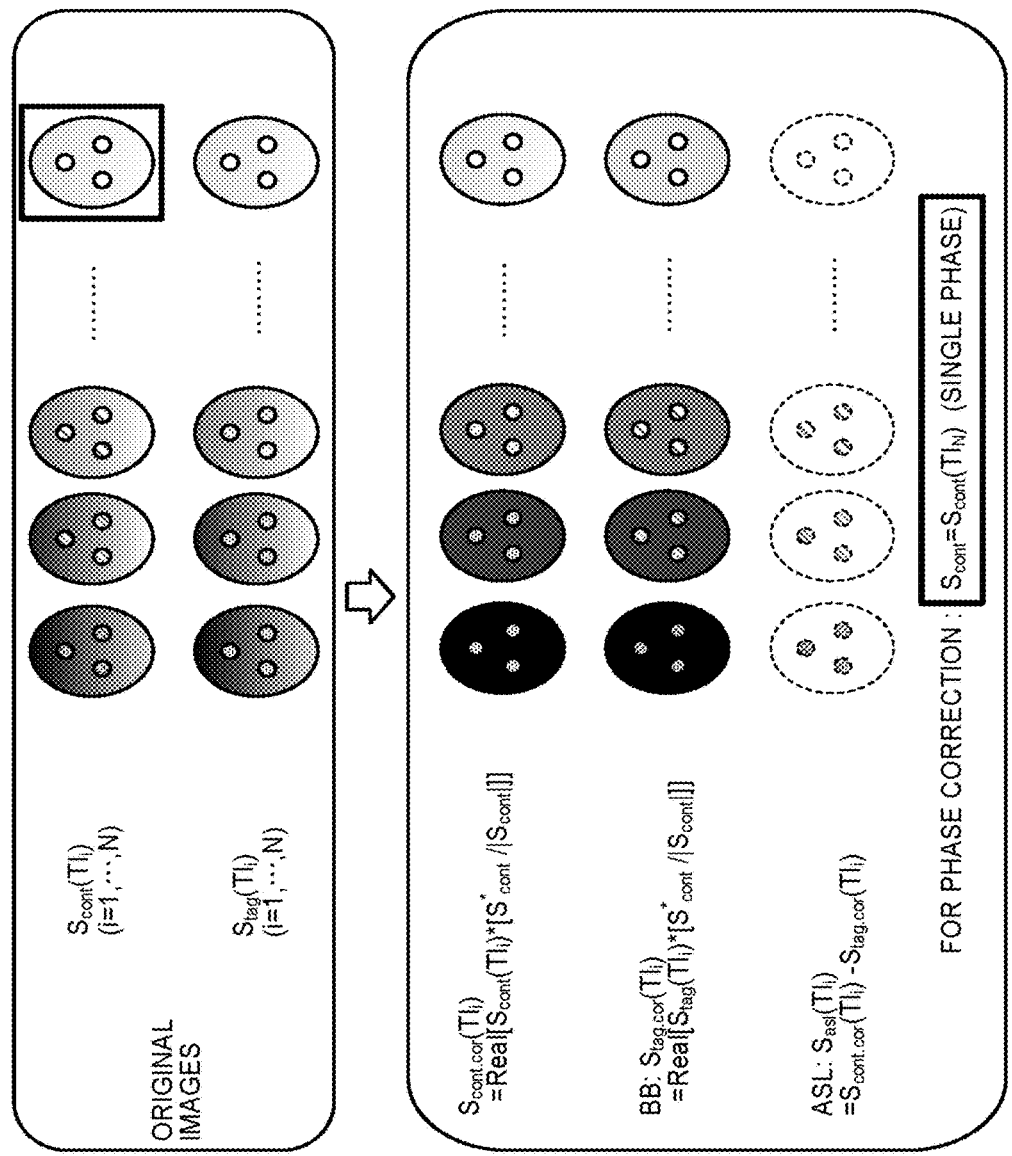

FIGS. 8 to 10 are schematics of one example of the STEP_FAIR_N-N method according to the first embodiment. For example, as illustrated in FIG. 8, in the STEP_FAIR_N-N method, an application region 82 of a tag pulse is set to include an upper stream portion of blood B flowing into an imaging region 81 of a subject and the imaging region 81. For example, the application region 82 of the tag pulse is set to be a size larger enough to include the upper stream portion of the blood B and the imaging region 81. The tag pulse, for example, may be applied with no region selected. An application region 83 of a control pulse is set to include the imaging region 81. For example, the application region 83 of the control pulse is set to be a size of an extent for containing only the imaging region 81 and to be a size smaller than the application region 82 of the tag pulse. Each region of the imaging region 81 and application regions 82 and 83 are set by the setting function 13a.

Then, the collecting function 14a performs data collection of the tag mode and data collection of the control mode for each of $TI_1, TI_2, TI_3, \ldots TI_{N-1}$, and $TI_N$, where $TI_1 < TI_2 < TI_3 < \ldots < TI_{N-1} < TI_N$.

For example, as illustrated in the upper side of FIG. 9, the collecting function 14a performs data collection (read-out) of the imaging region 81 at a time when $TI_1$ elapses after applying a tag pulse (Tag-IR) to the application region 82 of the tag pulse, as data collection of the tag mode. After that, the collecting function 14a performs data collection of the tag mode for each TI while changing the TI in order of $TI_2, TI_3, \ldots TI_{N-1}, TI_N$. The collecting function 14a performs data collection of the imaging region 81 at a time when $TI_1$ elapses after a similar control pulse (Control-IR) to the tag pulse is applied to the application region 83 of the control pulse, as data collection of the control mode. After that, the collecting function 14a performs data collection of the control mode for each TI while changing the TI in order of $TI_2, TI_3, \ldots TI_{N-1}, TI_N$. An example in FIG. 9 illustrates a case in which a flip angle $FA_{tag}$ of the tag pulse and a flip angle $FA_{cont}$ of the control pulse are set to be $FA_{tag}=FA_{cont}=180°$.

In this case, for example, as illustrated in the lower side of FIG. 9, in the tag mode, blood labeled by the tag pulse flows into the imaging region 81 while being gradually relaxed from a state where the longitudinal magnetization Mz is inverted as the TI becomes longer (tagged blood illustrated in FIG. 9). In the control mode, because saturated blood flows into the imaging region 81, the longitudinal magnetization Mz of blood inverted by the control pulse is immediately relaxed to a saturated state (control blood illustrated in FIG. 9). On the other hand, because the longitudinal magnetization Mz of the background tissue is similarly inverted in the tag mode and the control mode, the longitudinal magnetization Mz of the background tissue becomes substantially the same (stationary tissue illustrated in FIG. 9). Therefore, when the tag image and the control image are differentiated, an image is acquired in which a signal value in the background tissue portion is inhibited and a blood portion is emphasized.

For example, the collecting function 14a divides k-space into a plurality of regions according to a size of the k-space and performs data collection of $TI_1$ to $TI_N$ for each divided region. For example, the collecting function 14a repeats data collection of $TI_1$ to $TI_N$ for each divided region at prescribed time ($T_{repeat}$) intervals.

Subsequently, the first generation function 15a performs phase correction for data collected by the collecting function by using data in which the longitudinal magnetization of blood is positive from among collected data of a plurality of time phases to generate a BB image for each time phase. The BB image is generated as a T1 W image in which the inside of a blood vessel is a negative signal. Hereinafter, a time phase is represented by "i" and time phases corresponding to $TI_1, \ldots, TI_N$ are each represented by $i=1, \ldots, N$.

For example, as illustrated in the upper side of FIG. 10, the first generation function 15a performs Fourier transform, for data collected by the tag mode for each time phase to generate a tag image $S_{tag}(TI_i)$. Furthermore, the first generation function 15a performs Fourier transform, for data collected by the control mode for each time phase to generate a control image $S_{cont}(TI_i)$. Each of the tag image $S_{tag}(TI_i)$ and the control image $S_{cont}(TI_i)$ is generated as a complex image.

After that, the first generation function 15a performs phase correction for each of the tag image $S_{tag}(TI_i)$ and the control image $S_{cont}(TI_i)$ for each time phase. The first generation function 15a generates a real image from each of the phase corrected tag image and the control image for each time phase to generate a BB image $S_{tag.cor}(TI_i)$ and a corrected control image $S_{cont.cor}(TI_1)$. In this time, the first generation function 15a uses a control image in which the longitudinal magnetization of blood is positive from among a plurality of control images $S_{cont}(TI_i)$, as phase data for phase correction. Here, as one example, the first generation function 15a uses a control image $S_{cont}(TI_N)$ of the final phase N having the highest probability of the longitudinal magnetization of blood being positive.

For example, as illustrated in the lower side of FIG. 10, the first generation function 15a generates a BB image $S_{tag.cor}(TI_1)$ and a corrected control image $S_{cont.cor}(TI_i)$ from the tag image $S_{tag}(TI_i)$ and the control image $S_{cont}(TI_i)$ according to the following formulae (5) and (6), where the $S_{cont}$ is phase data for phase correction and the $S_{cont}$ equals $S_{cont}(TI_N)$.

$$S_{tag.cor}(TI_i)=\text{Real}[S_{tag}(TI_i)*\text{Conj}(S_{cont})/|S_{cont}|] \quad (5)$$

$$S_{cont.cor}(TI_i)=\text{Real}[S_{cont}(TI_i)*\text{Conj}(S_{cont})/|S_{cont}|] \quad (6)$$

As described above, in the STEP_FAIR_N-N method, phase correction is performed for both of the tag image $S_{tag}(TI_i)$ and the control image $S_{cont}(TI_i)$. In this manner, an encode of both of a signal value of blood and a signal value of a background tissue can be reproduced.

After that, the first generation function 15a differentiates the BB image $S_{tag.cor}(TI_i)$ generated from the tag image $S_{tag}(TI_i)$ and the corrected control image $S_{cont.cor}(TI_1)$ for each time phase to generate a blood image $S_{asl}(TI_i)$.

For example, as illustrated in the lower side of FIG. 10, the first generation function 15a generates a blood image $S_{asl}(TI_i)$ from the BB image $S_{tag.cor}(TI_i)$ and the corrected control image $S_{cont.cor}(TI_i)$ according to the following formula (7).

$$S_{asl}(TI_i)=S_{cont.cor}(TI_i)-S_{tag.cor}(TI_i) \quad (7)$$

The first generation function 15a preserves each generated image in the storage circuitry 11, and in response to a request from an operator, reads out the requested image from the storage circuitry 11 and outputs the image to the display 10.

In the above-described example, although data collection of the tag mode and data collection of the control mode are alternatively performed, embodiments are not limited thereto. For example, the collecting function 14a may perform data collection of the control mode for all TI after performing data collection of the tag mode for all TI. By contrast, the collecting function 14a may perform data collection of the tag mode for all TI after performing data collection of the control mode for all TI.

In the above-described example, although data collection is continuously performed in plural times by one tag pulse or control pulse, embodiments are not limited thereto. For example, the collecting function 14a may continuously perform data collection for one time-phase by one tag pulse or control pulse for each TI.

In the above-described example, although an example of a case in which phase correction is performed for all time phases has been described, embodiments are not limited thereto. For example, in a case in which a flip angle $FA_{tag}$ of the tag pulse is $FA_{tag}<90°$ or a flip angle $FA_{cont}$ of the control pulse is $FA_{cont}<90°$, or in a case in which the TI is so long that a signal value of a blood vessel is positive even though a flip angle $FA_{tag}$ is $90°<FA_{tag}<180°$ or a flip angle $FA_{cont}$ is $90°<FA_{cont}<180°$, phase correction may not necessary be performed.

In the above-described example, although a control image of the final time phase is used as phase data for phase correction, embodiments are not limited thereto. As described above, in the control mode of the STEP-_FAIR_N-N method, the longitudinal magnetization Mz of blood inverted by the control pulse is immediately relaxed to a state of being saturated. Therefore, when the longitudinal magnetization of blood is positive, a control image of the other time phase may be used as phase data for phase correction. Furthermore, for example, separately collected TOF image can be used as phase data for phase correction. That case, for example, eliminates the need for waiting until data in which the longitudinal magnetization is positive, is collected, and therefore $T_{repeat}$ can be shorten.

In the present embodiment, after the BB image, the blood image, etc. are generated as described above, the second generation function 15b performs an operation in a time phase direction by using the image generated for each time phase by the first generation function 15a to generate a calculated image.

For example, the second generation function 15b applies a filter to the image generated for each time phase, in a time phase direction to perform smoothing of the signal value. In this manner, the signal to noise ratio (SNR) of each image can be improved. For example, when data is collected by the imaging method of the STAR system, a background tissue portion is not changed and only a blood vessel portion is changed, and therefore more intense smoothing is possible.

The second generation function 15b may apply different weighted filters in the fluid portion and the background tissue portion. For example, the second generation function 15b extracts the blood vessel portion by performing threshold processing, for example, by using an MIP image of a blood image and uses the extracted blood vessel portion as a mask, to divide the blood vessel portion and the background tissue portion of each image. Furthermore, for example, the second generation function 15b uses different filters in the blood vessel portion and the background tissue portion so that the blood vessel portion is weakly smoothed in the time phase direction and the background tissue portion is strongly smoothed in the time phase direction. In this manner, the SNR of the background tissue portion can be improved without affecting the blood vessel portion. That is, the SNR of the background tissue portion can be improved while quick change in the blood vessel portion is maintained. A signal value may be simply averaged instead of applying of a filter, for the background tissue portion.

For example, when data is collected by the imaging method of the FAIR system, because both of the blood vessel portion and the background tissue portion are T1 relaxed, the signal value of the background tissue portion cannot be simply averaged. Therefore, in this case, the second generation function 15b uses, for example, a weighted filter.

Even in this case, because the blood vessel portion and the background tissue portion can be divided by using the blood image, different weighted filters can be applied in the blood vessel portion and the background tissue portion.

Figure 11:
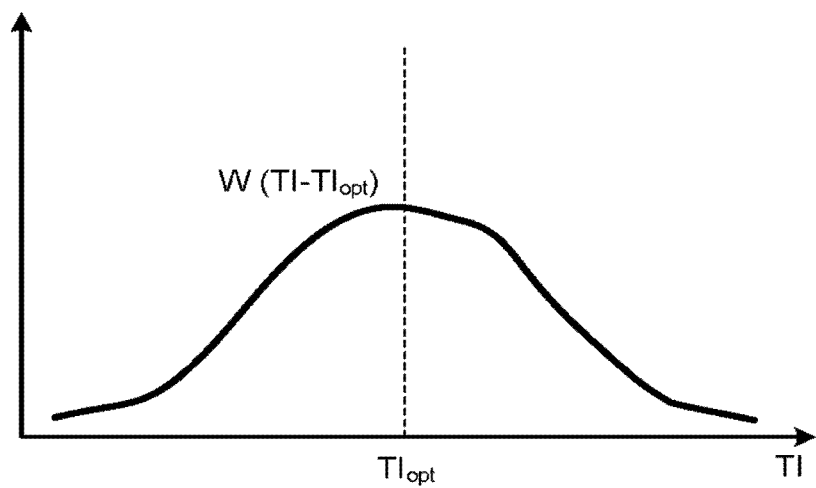
FIGS. 11 and 12 are schematics of an example of a weighted filter used in a second generation function according to the first embodiment.
Figure 12:
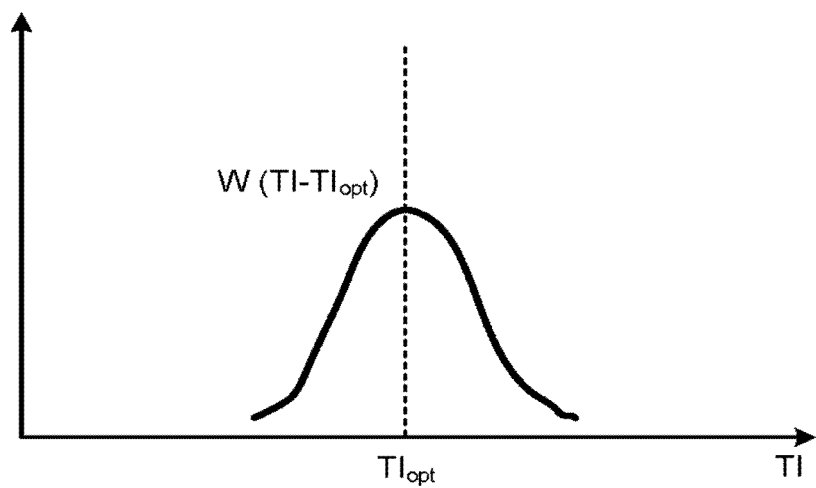

FIGS. 11 and 12 are schematics of one example of a weighted filter used by the second generation function 15b according to the first embodiment. FIG. 11 illustrates a weighted filter W (TI) for the background tissue portion and FIG. 12 illustrates a weighted filter W (TI) for the blood vessel portion. Each filter is defined as a weighting function.

For example, as illustrated in FIGS. 11 and 12, the second generation function 15b uses a filter of which weighting with respect to the signal value becomes smaller as a TI of the image separates farther from the $TI_{opt}$ being a base, in the time phase direction. As the $TI_{opt}$ being the base, for example, a TI in which the blood vessel is drawn in the largest range, the TI in which the CNR of the blood vessel and the background tissue becomes the highest, a TI in which the CNR of the T1W image of the background tissue becomes the highest, or the like is used.

For example, the second generation function 15b defines a filter $W_0$ (TI) being a basic form and shifts the filter $W_0$ (TI) depending on whether the filter is for a blood vessel portion or a background tissue portion, and uses the shifted filter $W_0$ (TI). For example, as illustrated in FIGS. 11 and 12, a filter that is larger in the time phase direction compared with a blood vessel portion is used for a background tissue portion. The second generation function 15b, for example, may shift the filter $W_0$ (TI) depending on the TI.

The second generation function 15b may perform an operation for the image generated for each time phase by the first generation function 15a after applying a weighted filter in the time phase direction. For example, the second generation function 15b performs maximum intensity projection processing, minimum intensity projection processing, or averaging for a signal value in the time phase direction, to generate a calculated image.

Operators are defined, for example, as follows. Hereinafter, a time phase is represented by "i" and time phases corresponding to $TI_i, \ldots, TI_N$ are each represented by i=1, ..., N.

Conv [A, B]: Convolution of function A and function B
tMIP[ ]: Maximum intensity projection in time direction
tminIP[ ]: Minimum intensity projection in time direction
tAve [ ]: Average or weighted average in time direction For example, the second generation function 15b, when data collection has been performed by the imaging method of the STAR system, performs maximum intensity projection in the time direction according to the following formula (8) by using a blood image $S_{asl}(TI_i)$ and a weighting filter W1 ($TI_i$) to generate a calculated image $S_{proc}$. In this example, the calculated image $S_{proc}$ can be used as a WB image in which the inside of a blood vessel is a positive signal.

$$S_{proc}=tMIP[\text{Conv}[W1(TI_i),S_{asl}(TI_i)]] \tag{8}$$

For example, the second generation function 15b performs maximum intensity projection in the time direction according to the following formula (9) by using a control image $S_{cont}(TI_i)$ and a weighting filter W1($TI_i$) to generate a calculated image $S_{proc}$. In this example, the calculated image $S_{proc}$ can be used as a WB image in which the inside of a blood vessel is a positive signal.

$$S_{proc}=tMIP[\text{Conv}[W1(TI_i),S_{cont}(TI_i)]] \tag{9}$$

For example, the second generation function 15b, when data collection has been performed by the imaging method of the STAR system, performs minimum intensity projection in the time direction according to the following formula (10) by using a BB image $S_{tag.cor}(TI_i)$ and a weighting filter W1 ($TI_i$) to generate a calculated image $S_{proc}$.

$$S_{proc}=tminIP[\text{Conv}[W1(TI_i),S_{tag.cor}(TI_i)]] \tag{10}$$

For example, the second generation function 15b, when data collection has been performed by the imaging method of the FAIR system, performs averaging in the time direction according to the following formula (11) by using a BB image $S_{tag.cor}(TI_i)$ and a weighting filter W1 ($TI_i$) to generate a calculated image $S_{proc}$. In this example, by performing averaging in addition to the weighting filter, the SNR can be further improved.

$$S_{proc}=tAve[\text{Conv}[W1(TI_i),S_{tag.cor}(TI_i)]] \tag{11}$$

For example, the second generation function 15b uses a BB image $S_{tag.cor}(TI_i)$ and a blood image $S_{asl}(TI_i)$, as well as a weighting filters W1($TI_i$), W2($TI_i$), and W3($TI_i$) to generate a calculated image $S_{proc1}(TI_i)$, according to the following formula (12) for the blood vessel portion and the following formula (13) for the portion other than the blood vessel portion. Each of the weighting filters has higher intensity of smoothing in order of W1($TI_i$), W2($TI_i$), and W3(TI$_i$). In the formula (12), a is any coefficient. In this example, the contrast of the blood vessel portion can be further improved.

$$S_{proc1}(TI_i)=\text{Conv}[W2(TI_i),S_{tag.cor}(TI_i)]-\alpha*\text{Conv}[W1(TI_i),S_{asl}(TI_i)] \quad (12)$$

$$S_{proc1}(TI_i)=\text{Conv}[W3(TI_i),S_{tag.cor}(TI_i)] \quad (13)$$

For example, the second generation function 15b generates a calculated image $S_{proc2}$ according to the following formula (14) when data collection has been performed by the imaging method of the STAR system, and according to the following formula (15) when data collection has been performed by the imaging method of the FAIR system.

$$S_{proc2}=t\min IP[S_{proc1}(TI_i)] \quad (14)$$

$$S_{proc2}=tAve[S_{proc1}(TI_i)] \quad (15)$$

Although the operation is performed after the weighted filter is applied in the time phase direction in the above-described example, embodiments are not limited thereto. That is, the second generation function 15b may perform each operation without applying the weighted filter in the time phase direction.

The second generation function 15b preserves each generated calculated image in the storage circuitry 11, and in response to a request from an operator, reads out the requested calculated image from the storage circuitry 11 and outputs the image to the display 10.

The exemplary configuration of the MRI apparatus 100 according to the present embodiment has been described. Each processing function of the above-described processing circuitries 12 to 15, for example, is stored in the storage circuitry 11 in a form of a computer executable program. Each of the processing circuitries reads out each program from the storage circuitry 11 and executes the read-out program to achieve processing function corresponding to the program. In other words, each of the processing circuitries 12 to 15 that has read out each program has each processing function illustrated in FIG. 1.

Figure 13:
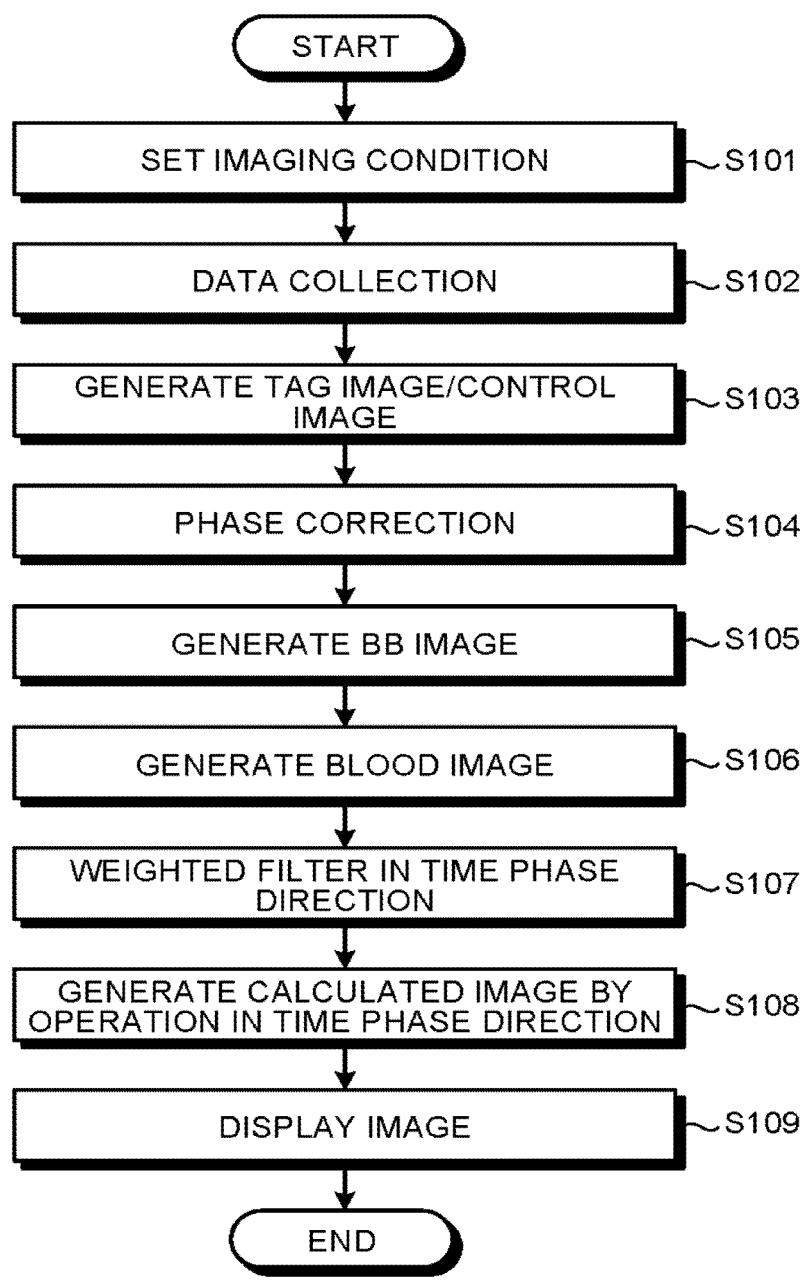
FIG. 13 is a flow chart of processing of a STEP method according to the first embodiment.

FIG. 13 is a flow chart for processing of a STEP method according to the first embodiment. For example, as illustrated in FIG. 13, in the present embodiment, first, the setting function 13a sets an imaging condition (step S101). In this time, the setting function 13a sets a pulse sequence, an imaging region, an application region of a tag pulse and a control pulse, and the like for performing the above-described STEP_ASTAR_N-N method, STEP_ASTAR_N-1 method, STEP_FAIR_N-N method, or the like.

Successively, the collecting function 14a executes data collection such as the STEP_ASTAR_N-N method, STEP_ASTAR_N-1 method, or STEP_FAIR_N-N method (step 3102).

Successively, the first generation function 15a performs Fourier transform, for data collected by the collecting function 14a for each time phase to generate both or one of a tag image and a control image (step S103). In this time, the first generation function 15a generates both of a tag image and a control image in the case of the STEP_ASTAR_N-N method and the STEP_FAIR_N-N method and generates a tag image in the case of the STEP_ASTAR_N-1 method.

After that, the first generation function 15a performs phase correction to both or one of a tag image and a control image for each phase (step S104). In this time, the first generation function 15a performs phase correction with respect to a tag image in the case of the STEP_ASTAR_N-N method and the STEP_ASTAR_N-1 method, and with respect to both of a tag image and a control image in the case of the STEP_FAIR_N-N method.

After that, the first generation function 15a generates a BB image for each phase (step S105). In this time, the first generation function 15a generates a real image from the corrected tag image to generate a BB image.

Furthermore, the first generation function 15a generates a blood image for each phase (step S106). In this time, the first generation function 15a differentiates a BB image and a control image to generate a blood image in the case of the STEP_ASTAR_N-N method. The first generation function 15a differentiates a BB image and a tag image of the final time phase to generate a blood image in the case of the STEP_ASTAR_N-1 method. The first generation function 15a differentiates a BB image and a correction control image to generate a blood image in the case of the STEP_FAIR_N-N method.

Successively, the second generation function 15b applies a weighted filter in the time phase direction with respect to the generated image for each time phase by the first generation function 15a (step S107). After that, the second generation function 15b performs an operation in the time phase direction using the image applied with the weighted filter to generate a calculated image (step S108). Then, the first generation function 15a or the second generation function 15b, in response to a request from an operator, outputs the image generated by each of the generation functions to the display 10 (step S109).

Among the above-described steps, the step S101, for example, is achieved by calling a predetermined program corresponding to the setting function 13a from the storage circuitry 11 and executing the program by the processing circuitry 13. Furthermore, the step S102, for example, is achieved by calling a predetermined program corresponding to the collecting function 14a from the storage circuitry 11 and executing the program by the processing circuitry 14. Steps S103 to S106, for example, are achieved by calling a predetermined program corresponding to the first generation function 15a from the storage circuitry 11 and executing the program by the processing circuitry 15. Furthermore, step S107 and S108, for example, are achieved by calling a predetermined program corresponding to the second generation function 15b from the storage circuitry 11 and executing the program by the processing circuitry 15. The step S109, for example, is achieved by calling a predetermined program corresponding to the first generation function 15a and a predetermined program corresponding to the second generation function 15b from the storage circuitry 11 and executing the program by the processing circuitry 15.

As described above, in the first embodiment, a blood image, a BB image, and a WB image, in which blood kinetics are reflected are acquired. Furthermore, by performing an operation in the time phase direction, compared with the BB image of a single time phase, a BB image in which blood is drawn in a range of larger space is acquired. Moreover, various types of images are acquired by one imaging.

Accordingly, in the first embodiment, an image in which fluid and a background tissue are more preferably drawn according to fluid kinetics over a plurality of time phases can be acquired.

The above-described embodiment can be performed in various different forms by modifying a part of the configuration of the MRI apparatus 100. The following describes some modifications according to the above-described embodiment, as other embodiments.

Second Embodiment

For example, as a second embodiment, the second generation function 15b may perform the above-described operation after applying a filter including T1 relaxation correction to the first image generated by the first generation function 15a.

In a blood image, with a longer TI, a signal value decreases by T1 relaxation and a blood vessel becomes buried under noises and hard to be seen. Therefore, the second generation function 15b uses a Weiner filter (WF) with T1 relaxation correction to correct the blood image.

This correction is performed with respect to data of k-space for each time phase. The timing when the correction is performed may be immediate after echo data is collected and may be after an image is generated. In the case in which the correction is performed after an image is generated, the correction is performed after Fourier transform is performed at least in a direction to which the WF is applied in a state of a complex image, and then an inverse Fourier transform is performed. For example, in the case in which 3D collection is performed, the WF may be applied to all directions of the k-space.

Figure 14:
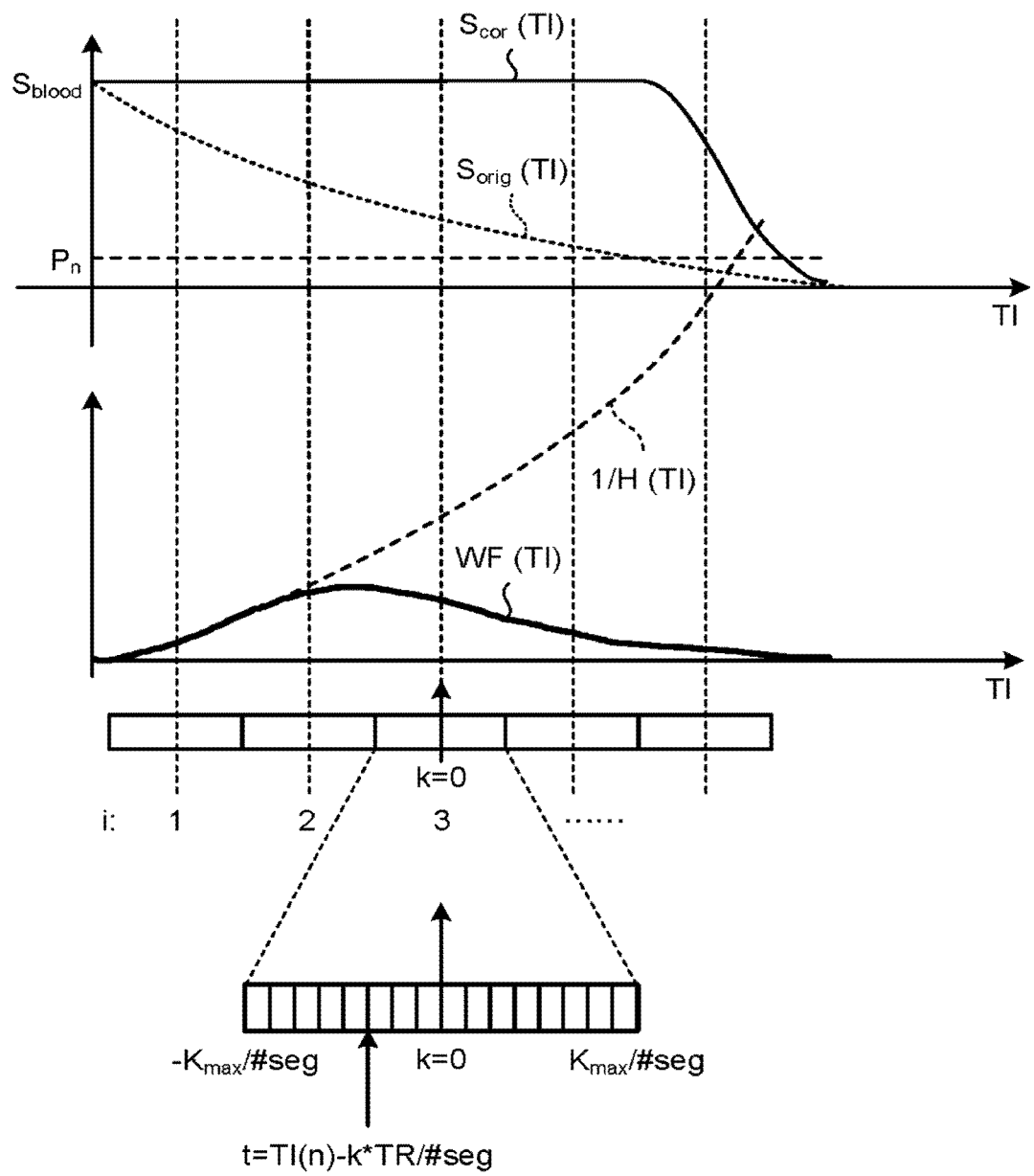
FIG. 14 is a schematic of an example of T1 relaxation and correction according to a second embodiment.

FIG. 14 is a schematic of an example of T1 relaxation correction according to the second embodiment. Herein, an example of a case in which the WF is applied to a phase encode, is described. FIG. 14 illustrates data of the k-space and right and left directions represent phase encode directions. FIG. 14 further illustrates an example of a case in which data of the k-space is filled to a sequential at sampling intervals TR by setting a segment number (division number) #seg in dividing data of the k-space into a plurality of regions and collecting the data, to be 1. Then, a plurality of pieces of data of k-space are filled in order, for each TI.

A gain H(k) of T1 relaxation with respect to n-th data ($TI=TI_n$) in the phase encode direction of the k-space, for example, is represented by the following formula (16).

$$H(k)=\exp[-[TI_n-k*TR/\#seg/T1_{eff.blood}]] \quad (16)$$

In the formula, $T1_{eff.blood}$ is an effective T1 value of blood and is determined from the $T1_{blood}$ being T1 of true blood, a TR, and a flip angle. A fixed value of a nominal value conformed to the intensity of the magnetic field is used for the $T1_{blood}$.

In this case, for example, the second generation function 15b generates a WF according to the following formula (17).

$$WF(k)=H^*(k)*P_s(k)/[|H(k)|^2*P_s(k)+P_n] \quad (17)$$

In the formula, k is a wave number of the k-space in the phase encode direction and H*(k) is a complex conjugate of the H(k). $P_s(k)$ is a signal intensity of the k-space and the $P_n$ is a noise intensity. For example, $P_n$ is determined from a high frequency portion in which a noise of the k-space becomes dominant, and is square mean value of the amplitude of data.

The second generation function 15b corrects data of the k-space according to the following formula (18). In the formula (18), the $S_{orig}(k)$ is a signal value before corrected and the $S_{cor}(k)$ is a signal value after corrected.

$$S_{cor}(k)=S_{orig}(k)*WF(k) \quad (18)$$

With such correction, for example, as illustrated in FIG. 14, the corrected signal value $S_{cor}(k)$ changes until the TI where a noise cannot be ignored, similarly to a case in which a contrast agent with no relaxation is injected. That is, the signal value $S_{cor}(k)$ after corrected is uniform until the TI where a noise cannot be ignored and after that, the signal value $S_{cor}(k)$ attenuates to zero.

For example, as illustrated in FIG. 14, with a simple correction by the product of an inverse function 1/H(k) and a signal value, noise is more emphasized as TI is longer. However, with the WF, noise is more inhibited while relaxation is corrected, as TI is longer.

Furthermore, for example, in the imaging method of the FAIR system, a signal value of the background tissue fluctuates due to T1 relaxation, with respect to T1. Therefore, by applying the WF with respect to the image before differentiated, in addition to the image of blood after differentiated, the signal value of the background tissue becomes constant with respect to the TI. As a result, for example, in a case in which a heart or the like is displayed by a cine display, the variation of movement becomes easy to be observed. In this case, a T1 value changes according to tissue, it is required to use different T1 values for a gray matter (GM) and a white matter (WM) or measure each T1 value in advance.

In an example illustrated in FIG. 14, although the segment number #seg of the k-space is set to be 1, embodiments are not limited thereto.

Figure 15:
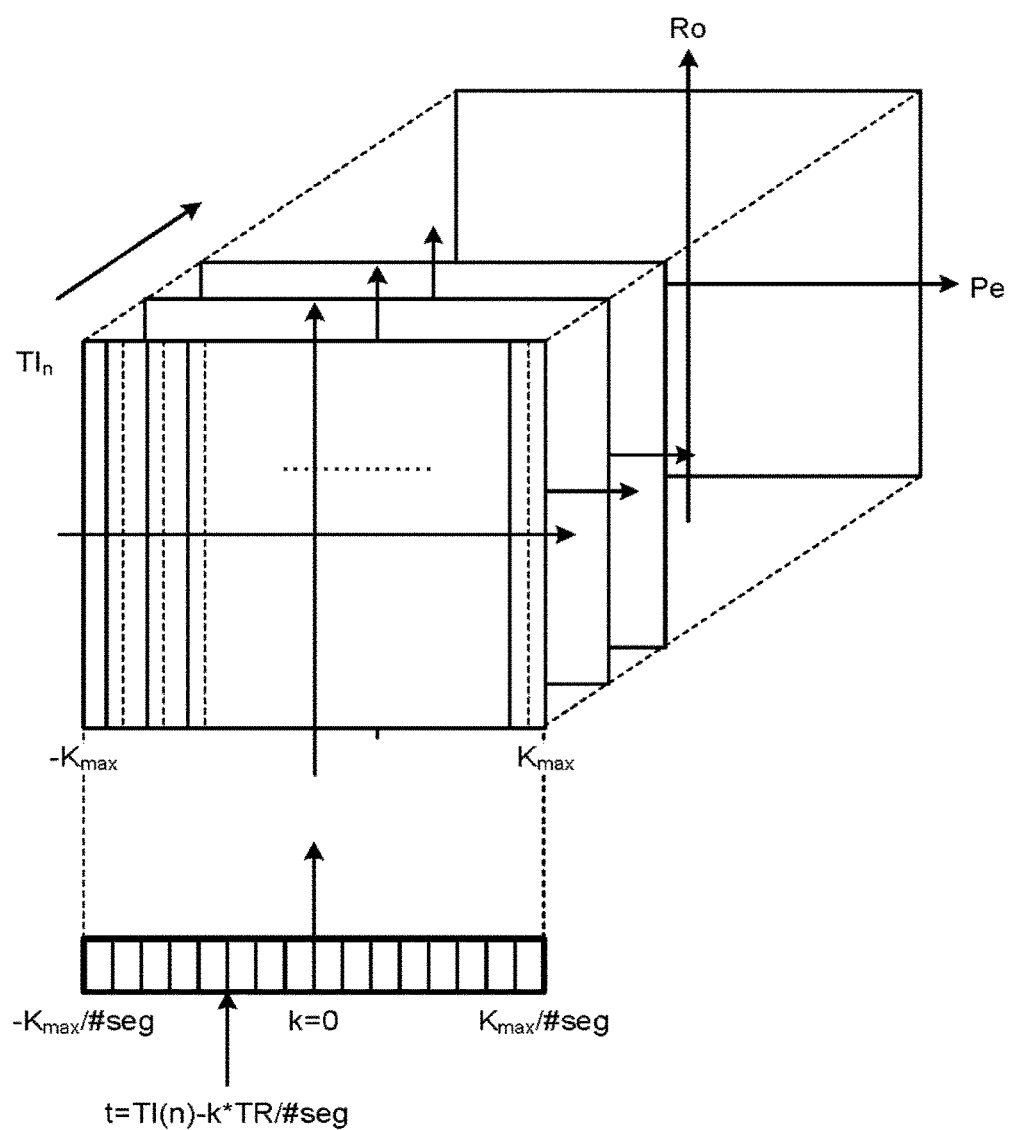
FIG. 15 is a schematic of an exemplary relation between k-space data and time direction data in a STEP method according to the second embodiment.

FIG. 15 is a schematic of an exemplary relation between k-space data and time direction data in a STEP method according to the second embodiment. For example, as illustrated in FIG. 15, when a segment number #seg is set to be 2, one k-space is filled in twice by one TI. For example, for one k-space, data collected by first data collection and data collected by second data collection are alternatively filled along the phase-encoding direction. By data collection for a plurality of TI being performed, a plurality of pieces of data of k-space is collected in order. Even in such case, a WF can be applied similarly to a case in which a segment number #seg is set to be 1.

Third Embodiment

As a third embodiment, for example, by performing data collection synchronously with a biosignal of a subject by the collecting function 14a and performing an operation in the time phase direction by using an image generated by the first generation function 15a by the second generation function 15b, an image in which a movement of the subject indicated by the biosignal is reflected may be generated as a calculated image.

For example, the collecting function 14a acquires a gate signal transmitted from an ECG sensor mounted on a surface of the body of a subject and performs data collection synchronously with the acquired gate signal. Furthermore, for example, the collecting function 14a may acquire a pulse wave signal output from a pulse wave sensor mounted on a surface of the body of a subject and perform data collection synchronously with the acquired pulse wave signal.

Moreover, for example, the collecting function 14a may acquire a respiratory signal output from a respiratory sensor mounted on the abdomen of a subject or the like and perform data collection synchronously with the acquired respiratory signal. The respiratory sensor detects a movement due to respiration as an air pressure, converts the detected air pressure into an electric signal, and outputs the electric signal as a respiratory signal.

Moreover, for example, the collecting function 14a may perform data collection synchronously with a navigator signal based on data collected from a region set in the abdomen of a subject. In this case, for example, the collecting function 14a collects an MR signal sent from near the diaphragm of the subject and acquires a signal indicating change of a position of the diaphragm as a navigator signal, on the basis of the collected MR signal.

In this case, because a shape of a heart, a major blood vessel system, and the like are changed depending on a time phase, it is desirable that data collection is performed by an imaging method of the STAR system that can maintain contrasts for each time phase stable without applying a tag pulse in an imaging region. For example, the collecting function 14a applies a tag pulse with a gate signal as a trigger and collects data for a plurality of time phases after the shortest delay time, and thereby, an image of a change from the systolic period to the diastolic period is formed.

By simultaneously using a respiratory gate in a heart to correct a movement due to respiration of an entire heart, fluctuation of only heartbeats becomes easy to be observed. Moreover, by using only a respiratory gate in a lung and organs in the abdomen, a movement of an organ and a lesion such as a tumor due to respiration may be observed. It is known that, by image observation of the time phase direction by synchronizing heartbeats and respiration, an extent of adhesion of a tumor or the like to a diaphragmatic wall and an extent of adhesion of a tumor to the dura mater in a head become easy to be acknowledged and this is useful for treatment planning.

The first to fourth embodiments has been described.

However, the STEP method is not limited to the above-described STEP_ASTAR_N-N method, STEP_ASTAR_N-1 method, and STEP_FAIR_N-N method. For example, in the STEP method, various combinations between an imaging method of the STAR system or an imaging method of the FAIR system, and the N-N differentiating method or the N-1 differentiating method, can be used.

Particularly, as combinations using an imaging method of the STAR system, there are three combinations of a combination with the N-N differentiating method, a combination with the N-1 differentiating method using a tag image, and a combination with the N-1 differentiating method using a control image. As combinations using imaging methods of the FAIR system, there are three combinations of a combination with the N-N differentiating method, a combination with the N-1 differentiating method using a tag image, and a combination with the N-1 differentiating method using a control image. Table 1 below lists each of the combinations and its feature.

TABLE 1

| | | Collection | Blood image | | BB image | | WB image | | | |
|---|---|---|---|---|---|---|---|---|---|---|
| | Method | Time | Kinetic | Static | Kinetic | Static | Kinetic | Static | Cine | T1 map |
| ASTAR | Tag-Control: N-N | 2 | Y | Y | Y | Y | Y | Y | Y | N |
| (STAR) | Tag: N-1 | 1 | Y | Y | Y | Y | N | Y | Y | N |
| | Control: N-1 | 1 | N | N | N | N | N | Y | Y | N |
| FAIR | Tag-Control: N-N | 2 | Y | Y | Y | Y | Y | Y | N | Y |
| | Tag: N-1 | 1 | N | N | N | Y | N | N | N | Y |
| | Control: N-1 | 1 | N | N | N | N | Y | Y | N | Y |

In the STEP method, a kinetic image of only blood or blood flow is acquired as a blood image, and because a BB image is acquired until a signal value of blood inverted by a tag pulse becomes zero, a clear kinetic image of a cardiac muscle and nearby major blood vessel wall is also acquired. Therefore, a kinetic image including not only the inside of a heart chamber but a coronary MRA can be acquired.

Fourth Embodiment

As a fourth embodiment, for example, by performing data collection by an imaging method of the FAIR system by the collecting function 14a, and by performing an operation as analyzation of the time phase direction including a fluid portion and a background tissue portion by using data of a plurality of time phases generated by the first generation function 15a by the second generation function 15b, a T1 map may be generated.

For example, the collecting function 14a generates a T1 map by curve fitting each point included in two or more images or performing analysis calculation, for the image for a plurality of time phases generated by the first generation function 15a. When an encoding mode, an echo number per 1 segment, TI, a number of time phases, $T_{repeat}$, TR, TE (Echo Time), and a flip angle are known, a T1 map can be determined by using an MPRAGE sequence as a magnetization prepared 2 rapid acquisition gradient echoes (MP2RAGE) method.

In this case, as a T1 value of a background tissue, a signal value of any of a tag image and a control image may be used and a signal value after the SNR is improved by averaging may be used. As a T1 value of blood, a signal value before inflow of blood that is not inverted by a tag pulse can be used.

In Table 1, the item "Blood image" indicates whether a blood image in which a background tissue has been substantially totally eliminated is acquired. The item "BB image" indicates whether a BB image in which a background tissue remains and a signal value of a blood vessel is lower than that of the background tissue is acquired. The item "WB image" indicates whether a WB image in which a background tissue remains and a signal value of a blood vessel is higher than that of the background tissue is acquired. The item "Kinetic" indicates whether kinetic observation is possible and the item "Static" indicates whether static image observation is possible. The item "Cine" indicates whether kinetic observation for a background tissue is possible under a substantially fixed condition. The item "T1 map" indicates whether a T1 map is acquired. In each item, "Y" indicates yes (possible) and "N" indicates no (impossible).

For example, as listed in Table 1, collection time in a method using the N-1 differentiating method is substantially half as that in a method using the N-N differentiating method. In a combination method of an imaging method of the STAR system and the N-N differentiating method and in a combination method of an imaging method of the FAIR system and the N-N differentiating method, kinetic observation and static observation are possible with any of a blood image, a BB image, and a WB image. In a combination method of an imaging system of the STAR system and the N-1 differentiating method using a tag image, kinetic observation and static observation are possible with a blood image and a BB image. When it is determined by whether kinetic observation for a background tissue is possible under a substantially fixed condition, cine is possible only by a method using an imaging method of the STAR system. A T1 map is possible only by a method using the FAIR system that inverts longitudinal magnetization of a background tissue in an imaging region (slab).

For both of the STAR system and the FAIR system, in a case in which either of the systems is combined with the N-N differentiating method that differentiates a tag image and a control image, because background tissue portions of both of the images become substantially the same signal, data in which the longitudinal magnetization is positive is not necessary for cancelling a background tissue portion by difference. Accordingly, there is no need to make the $T_{repeat}$ long for waiting recovery of the longitudinal magnetization Mz. However, in order to increase efficiency of a tag pulse, it is desirable that fresh blood in which the longitudinal magnetization is saturated is filled in an application region of the tag pulse during the $T_{repeat}$.

When an imaging method of the STAR system and the N-1 differentiating method are combined, because an image of the final time phase in the $T_{repeat}$ is considered as a substitute of a control image, it is desirable that the longitudinal magnetization of blood in an imaging region (slab) after being applied with a tag pulse is sufficiently recovered in the $T_{repeat}$ in addition to the condition for increasing efficiency of a tag pulse. Generally, the $T_{repeat}$ that is necessary for recovering the longitudinal magnetization of blood is longer in time than the $T_{repeat}$ that is necessary for increasing efficiency of a tag pulse. Therefore, when an imaging method of the STAR system and the N-1 differentiating method are combined, $T_{repeat}$ is set to be longer than that in a case in which an imaging method of the STAR system and the N-N differentiating method are combined.

When an imaging method of the STAR system and the N-1 differentiating method are combined, a signal value in a background tissue portion is maintained to be substantially stable between time phases, and therefore, to an imaging region, a saturation pulse is not applied before a tag pulse is applied. Therefore, because there is a case in which influence of the $T_{repeat}$ immediately before application of a tag pulse remains, it is desirable to set $T_{repeat}$ to be long (for example, about 2 to 3 seconds).

In a case in which the N-N differentiating method is used, in combination with the ASTAR method, it is not a problem that blood is not sufficiently saturated in a tag image (in combination with the STAR method, difference equivalent to MTS effect is generated). Even in combination with an imaging method of the FAIR system, in a control image to be differentiated, an imaging region to which a control pulse is applied is relatively thin (about 5 to 10 cm), and therefore, if the TI is a certain length (longer than about 0.5 second), blood can be considered as being substantially completely saturated. Therefore, although there is no case in which a peripheral portion of a blood vessel becomes hard to be drawn in a later time phase, similarly to the N-1 differentiating method in a case in which blood is not substantially completely saturated, time required for imaging becomes about twice.

Combinations of each imaging method and each differentiating method used in the STEP method and their features have been described. These combinations, for example, is used by being appropriately selected by an operator according to each of their features.

FIG. 1 illustrates an example of a case in which a processing function of the processing circuitry 12, a processing function of the processing circuitry 13, a processing function of the processing circuitry 14, and a processing function of the processing circuitry 15 are achieved by a single processing circuitry. However, embodiments are not limited thereto. For example, each of the processing circuitries may be constituted by combining a plurality of independent processors to achieve each of the processing functions by each of the processors performing each program. Each of the processing functions of each of processing circuitries may be achieved by being appropriately dispersed or integrated in a single or a plurality of the processing circuitries.

The term "processor" used in each of the above-described embodiments means a circuit such as a central processing unit (CPU), a graphics processing unit (GPU), an application specific integrated circuit (ASIC), a programmable logic device (such as a simple programmable logic device (SPLD) and a complex programmable logic device (CPLD), and a field programmable gate array (FPGA). A program may be directly incorporated in a circuit of a processor, instead of being stored in storage circuitry. In this case, the processor achieves a function by reading out the program incorporated in the circuit and performing the program. Each processor of the embodiments is not limited to a case of being configured as a single circuit for each processor, and may achieve the function by being configured as one processor by a plurality of independent circuits being combined.

According to at least one of the above-described embodiments, an image in which fluid and a background tissue are more preferably drawn according to kinetics of fluid over a plurality of time phases can be acquired.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising processing circuitry configured to
perform at least one of first data collection and second data collection, wherein the first data collection collects a plurality of first data by collecting data of an imaging region of a subject at a plurality of different times with predetermined time intervals after a tag pulse is applied to fluid flowing into the imaging region, and the second data collection collects a plurality of second data by collecting data of the imaging region at a plurality of different times with the predetermined time intervals by differing at least one of application or non-application of the tag pulse and a position of the applying in the first data collection; and
generate a plurality of first images respectively corresponding to a plurality of particular times of the plurality of different times from at least one of the first and second data collected at the particular times by performing phase correction for the at least one of the first and second data collected at the particular times, using phase data included in the first or second data, wherein the phase data is data collected at a timing when a longitudinal magnetization of the fluid is a positive value, and collected at a time other than the particular times.

2. The magnetic resonance imaging apparatus according to claim 1, wherein the processing circuitry is further configured to generate a second image by performing an operation in a time phase direction by using the plurality of first images.

3. The magnetic resonance imaging apparatus according to claim 2, wherein the processing circuitry is further configured to perform at least one of the first data collection and the second data collection by an imaging method of a signal targeting with an alternating radiofrequency (STAR) system or a flow-sensitive alternating inversion recovery (FAIR) system.

4. The magnetic resonance imaging apparatus according to claim 2, wherein the processing circuitry is further configured to generate the second image by performing maximum intensity projection, minimum intensity projection, or averaging for signal values of the plurality of first images in the time phase direction.

5. The magnetic resonance imaging apparatus according to claim 2, wherein the processing circuitry is further configured to perform the operation after a weighted filter is applied to the plurality of first images in the time phase direction.

6. The magnetic resonance imaging apparatus according to claim 5, wherein the processing circuitry is further configured to apply different weighted filters in a fluid portion and a background tissue portion in the plurality of first images.

7. The magnetic resonance imaging apparatus according to claim 2, wherein the processing circuitry is further configured to perform the operation after a filter including a T1 relaxation correction is applied to the plurality of first images.

8. The magnetic resonance imaging apparatus according to claim 2, wherein the processing circuitry is further configured to generate a difference image between a first image of the plurality of first images generated from the first data and a first image of the plurality of first images generated from the second data, a difference image between first images generated from the first data, or a difference image between first images generated from the second data, for each time.

9. The magnetic resonance imaging apparatus according to claim 2, wherein the processing circuitry is further configured to:
perform at least one of the first data collection and the second data collection by an imaging method of a flow-sensitive alternating inversion recovery (FAIR) system; and
generate a T1 map as the second image by analyzing a region including a fluid portion and a background tissue portion in the time phase direction by using the plurality of first images.

10. The magnetic resonance imaging apparatus according to claim 2, wherein the processing circuitry is further configured to:
perform at least one of the first data collection and the second data collection synchronously with a biosignal of the subject; and
generate an image in which a movement of the subject indicated by the biosignal is reflected, as the second image, by performing the operation in the time phase direction by using the plurality of first images.

11. A magnetic resonance imaging method, comprising
performing, by processing circuitry, at least one of first data collection and second data collection, wherein the first data collection collects a plurality of first data by collecting data of an imaging region of a subject at a plurality of different times with predetermined time intervals after a tag pulse is applied to fluid flowing into the imaging region, and the second data collection collects a plurality of second data by collecting data of the imaging region at a plurality of different times with the predetermined time intervals by differing at least one of application or non-application of the tag pulse and a position of the applying in the first data collection; and
generating, by the processing circuitry, a plurality of first images respectively corresponding to a plurality of particular times of the plurality of different times from at least one of the first and second data collected at the particular times by performing phase correction for the at least one of the first and second data collected at the particular times, using phase data included in the first or second data, wherein the phase data is data collected at a timing when a longitudinal magnetization of the fluid is a positive value, and collected at a time other than the particular times.

* * * * *